United States Patent
Kurata et al.

(10) Patent No.: US 7,184,318 B2
(45) Date of Patent: Feb. 27, 2007

(54) SEMICONDUCTOR MEMORY DEVICE

(75) Inventors: Hideaki Kurata, Kodaira (JP); Kazuo Otsuga, Kokubunji (JP); Yoshitaka Sasago, Tachikawa (JP); Takashi Kobayashi, Tokorozawa (JP); Tsuyoshi Arigane, Akishima (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/197,485

(22) Filed: Aug. 5, 2005

(65) Prior Publication Data

US 2006/0039195 A1    Feb. 23, 2006

(30) Foreign Application Priority Data

Aug. 20, 2004  (JP)  ............................. 2004-240594

(51) Int. Cl.
*G11C 11/34* (2006.01)
*G11C 16/04* (2006.01)

(52) U.S. Cl. ............................. 365/185.28; 365/185.14
(58) Field of Classification Search ........... 365/185.28, 365/185.14, 185.18
See application file for complete search history.

(56) References Cited

U.S. PATENT DOCUMENTS

| 6,754,105 B1 * | 6/2004 | Chang et al. ........... 365/185.18 |
| 6,819,592 B2 * | 11/2004 | Noguchi et al. ....... 365/185.17 |
| 6,909,635 B2 * | 6/2005 | Forbes et al. ............... 365/174 |
| 7,049,651 B2 * | 5/2006 | Mikolajick et al. ......... 257/315 |

FOREIGN PATENT DOCUMENTS

JP    2001-156275    8/2001

OTHER PUBLICATIONS

Sasago et al., "90-nm-mode multi-level AG-AND type flash memory with cell size of true 2 $F^2$/bit and programming throughput of 10 MB/s", IEEE International Electron Devices Meeting, 2003, pp. 29-32.

Arai et al., "High-Density (4.4$F^2$) NAND Flash Technology Using Super-Shallow Channel Profile (SSCP) Engineering", International Electron Devices Meeting, 2000, p. 775-778.

Kobayashi et al., "A Giga-Scale Assist-Gate (AG)-AND-Type Flash Memory Cell with 20-MB/s Programming Throughput for Content-Downloading Applications", International Electron Devices Meeting, 2001, pp. 29-32.

Eitan et al., "Can NROM, a 2 Bit, Trapping Storage NVM Cell, Give a Real Challenge to Floating Gate Cells?", International Conference on Solid State Devices and Materials, 1999, pp. 522-524.

* cited by examiner

*Primary Examiner*—Anh Phung
(74) *Attorney, Agent, or Firm*—Miles & Stockbridge P.C.

(57) ABSTRACT

Suppressing a leakage current is required in a flash memory because the channel length is made shorter with a reduction in the memory cell size. In an AND type memory array having an assist electrode, although the memory cell area has been reduced by the field isolation using a MOS transistor, leakage current in the channel direction becomes greater with a reduction in the memory cell size, resulting in problems arising like deterioration of programming characteristics, an increase in the current consumption, and reading failure. To achieve the objective, in the present invention, electrical isolation is performed by controlling at least one assist electrode of the assist electrodes wired in parallel to be a negative voltage during program and read operations and by making the semiconductor substrate surface in the vicinity of the aforementioned assist electrode non-conductive.

3 Claims, 22 Drawing Sheets

SEMICONDUCTOR MEMORY DEVICE

CLAIM OF PRIORITY

The present application claims priority from Japanese application JP 2004-240594 filed on Aug. 20, 2004, the content of which is hereby incorporated by reference into this application.

FIELD OF INVENTION

The present invention relates to the field of semiconductor memory devices, and more particularly relates to a low-cost and highly reliable semiconductor memory device.

BACKGROUND OF THE INVENTION

Flash memories which are nonvolatile have been used widely as a semiconductor memory device for portable data storage. The price per bit of a flash memory has been coming down year by year and the downward trend is more rapid than the trend expected from the reduction of memory cell size. This is due to ideas for the structure of a memory cell and the introduction of multilevel storage into a memory cell. A prior art of a high density flash memory for use in filing is described in, for instance, F. Arai et al, IEEE International Electron Devices Meeting, 2000, P. 775–778 and T. Kobayashi et al., IEEE International Electron Devices Meeting)", 2001, pp. 29–32. F. Arai et al, IEEE International Electron Devices Meeting, 2000, pp. 775–778 describes the achievement of a small memory cell area which is being called a NAND type. The latter describes the achievement of multilevel storage operation which performs multi-bit storage by controlling the number of electrons stored into a floating gate, which is being called an AND type. Both have the effect of reducing bit cost.

Moreover, B. Eitan et al., International Conference on Solid State Devices and Materials, 1999, pp. 5822–524 describes an example of another multilevel storage. This is an element in which SiN is used for a memory region and charge injection is performed by hot electrons. What is employed is the phenomena where hot electrons are created in the vicinity of the drain edge and where charges stay around the area where charges are injected because they are trapped at the SiN trap. Both the source edge and the drain edge are used as charge trapping layers by exchanging the voltages applied to the source and drain. Since a large current flows in this programming technique, it is not suitable for use in filing in which multi-bit simultaneous programming is performed because of limitations in the current drivability of the power supply. JP-A No. 156275/2001 discloses program operation by source side injection in which programming is possible by a lower drain current. F. Arai et al, IEEE International Electron Devices Meeting, 2000, pp. 775–778 describes an operation, in which an inversion layer formed underneath the assist electrode is used as a wiring, as a technology which is compatible with the assist electrode for source side injection and a small cell area.

Flash memory has achieved a bit cost reduction greater than the reduction of memory cell size by decreasing the patterning size as a result of ideas for the structure of an element and the introduction of multilevel storage. Additionally, applications which handle big files such as music files and animation, etc. have broadened with the increase in the density of a flash memory. Therefore, it is expected that there will be a rapid increase in demand in the near future for flash memory which has a high density and fast programming speed.

However, a NAND type element structure is coming closer to the area $4F^2$ per cell which is the logical limitation of a planar structured memory cell, and it is difficult to reduce the cell area by performing some more ideas for the structure. Therefore, it is necessary to promote multilevel storage in the future. At the same time, since it is a means for programming according to the Fowler-Nordheim (hereinafter, it is abbreviated as FN) tunnel, there is a problem that programming is not fast enough and a large voltage has to be used.

On the other hand, an AND type uses a hot electron programming technique, and high-speed programming is possible. It is also suitable for simultaneous programming of many cells because it is hot electron programming according to the method of source side injection. Additionally, since the array structure is connected in parallel and not connected in series such as a NAND type, it is not easily affected by the stored information in another cell and is suitable for multi-bit storage per cell. However, there is a problem. The problem is brought about from the viewpoint of the cell area. That is, since it has an array structure in which the diffusion layers are lying in parallel, the pitch in the direction perpendicular to the word line is not easily decreased caused by the broadening of the diffusion layer and the isolation region.

Y. Sasago et al., IEEE International Electron Devices Meeting, 2003, p. 29–32 discloses, as a means to solve this problem, an operation method in which an inversion layer formed underneath the electrode lying parallel to the data line is used for the wiring.

SUMMARY OF THE INVENTION

The following is a detailed description of an operation method disclosed in non-patent document 4 using FIGS. 1 to 4. FIG. 3 is a top view of a memory mat, and the cross-section at the position A–A' corresponds to FIG. 1. Moreover, FIG. 4 is an equivalent circuit corresponding to FIG. 3.

FIG. 1 is a cross-sectional structure of a memory element described in non-patent document 3. It has a triple well structure in which an n-type well region (NW) is provided on a p-type silicon substrate (SUB) and a p-type well region (PW) is further provided therein. Assist electrodes (AG0 to AG3) composed of n-type polycrystalline silicon to control the voltage of the surface of the silicon substrate and a control electrode (CG) composed of a stacked structure of n-type polycrystalline silicon and W (tungsten) are provided, and this control electrode (CG) also works as a word line. Charge trapping regions (FG0 to 5) composed of polycrystalline silicon are provided through the insulator film (OX1) composed of 8 nm thick $SiO_2$ provided at the surface of the silicon substrate (SUB). A $SiO_2$ insulator film (OX2) composed of 10 nm thick $SiO_2$ is formed between the charge trapping regions (FG0 to 5) and the control electrode (CG). Moreover, an insulator film (OX3) composed of 7 nm thick $SiO_2$ is provided between the assist electrodes (AG0 to AG3) and the silicon substrate (SUB). Such a structure is repeated in a memory cell array. Moreover, there is a feature that a groove filled with an insulator film which is generally provided for the isolation is not provided in this cross-section. Furthermore, the surfaces of the silicon substrate (SUB) underneath the assist electrodes (AG0 to AG3) and underneath the charge trapping region (FG) have different impurity concentrations.

FIG. 3 is a top view of a memory mat. Metallic wirings are omitted to make the explanation easier except for necessary parts. The base unit (hereinafter, it is called a memory mat) is assumed to be a structure in which n+1 (for instance, 256) word lines (WL0 to WLn) are repeated in a direction perpendicular to the drawing, and the assist electrodes (AG0 to AG3) are bundled (CT2) at the both ends for every four pieces, thereby, it is possible to apply voltages independently to the assist electrodes (AG0 to AG3). At the edge parts, there is a groove filled with an insulator film for the isolation, and the active regions are insulated from each other. Moreover, there is a feature that a structure exists in which the assist electrode (AG0) and an n-type impurity doped active region (diffusion layer region) (L0) overlap each other. However, the assist electrode (AG0) and the active region (diffusion layer region) (L0) are insulated by an insulator film formed on the surface of the silicon substrate (SUB). This active region (diffusion layer region) is connected to the metallic wirings through the contact structure (CT1). According to this structure, in the case when an inversion layer is formed at the surface of the substrate underneath the gate by applying a positive voltage to the assist electrode (AG0), it is possible to apply a voltage to the inversion layer from the metallic wirings through the active region (diffusion layer region) (L0). Moreover, an overlapped region with an n-type impurity doped active region (diffusion layer), a contact structure which supplies a voltage to this region, and wirings are also provided in the other assist electrodes (AG1, AG2, and AG3). A select MOS transistor is formed of a gate electrode (STD and STS) existing between the active region (diffusion layer region) (L0) and the contact structure (CT1) to the wirings The local bit line consisting of the inversion layer wiring is connected to the global data line through this select MOS transistor. A plurality of local data lines are connected to one piece of the global data line and a hierarchical data line structure is taken. This reduces the capacitance to charge and discharge, and is effective for high-speed operation and reduction of power consumption. At the same time, it can avoid applying a high data line voltage to the memory cell except for the case of programming to the selected memory mat, resulting in disturbances to unselected cells being reduced.

First, the program operation will be described. The cell to be programmed is assumed to be the memory cell surrounded by the broken line in FIG. 1 (M13 in FIG. 4). Positive voltages (for instance, 4 V to AG2 and 7 V to AG0) are applied to both ends of the trio of assist electrode lines (AG2 and AG0) to form the inversion layers (INV 2 and INV 4) at each surface of the silicon substrate (SUB) underneath the assist electrodes (AG2 and AG0). These inversion layers (INV 2 and INV 4) are fed from the diffusion layer regions (L2 and L4) at the ends of the memory mat. Moreover, a low positive voltage (for instance, 1.5 V) is applied to the center of the trio of assist electrodes (AG3), resulting in the silicon substrate (SUB) underneath the assist electrode (AG3) being weakly inverted. The outer line of the trio of assist electrodes (AG1) is controlled to be a low voltage (for instance 0 V), which is a level not allowing the formation of an inversion layer, resulting in electrical isolation being performed. The n-type diffusion layer regions (L2 and L4) are electrically connected to the inversion layers (INV2 and INV4) while forming the inversion layers, and a voltage can be applied from the global data lines (DL2 and DL4) through the contact structure (CT1) provided in the diffusion layer regions (L2 and L4). Herein, the inversion layer (INV2) underneath the assist electrode (AG2) functions as a source of the memory cell, and the global data line (DL2) supplying a voltage to this inversion layer (INV2) is controlled to be 0 V. Moreover, the inversion layer (INV4) underneath the assist electrode (AG0) another end functions as a drain of the memory cell and the global data line (DL4) supplying a voltage to this inversion layer (INV4) is controlled to be 4 V. The corresponding assist electrode (AG0) is controlled to be a sufficiently higher voltage (for instance 7 V) than the setting-voltage (herein, 4 V) to form the low-resistance inversion layer (INV4). When a high voltage pulse, for instance 15 V and 3 μs, is applied to the control electrode (CG), field concentration occurs at the surface of the silicon substrate (SUB) underneath the boundary of one edge of the assist electrode (AG3) and the storage node (FG3), resulting in hot electrons being created. The hot electrons created are induced by the electric field in a direction perpendicular to the substrate generated by the control electrode (CG) and inject into the adjacent storage node (FG3). Here, since the resistance of the inversion layer underneath the center assist electrode (AG3) is high, the current that flows between the inversion layer wiring (INV2) and the inversion layer wiring (INV4) is not so large so that the ratio of the injected electrons to the storage node can be made greater considering the flowing current. Accordingly, the current does not become too large, even during the simultaneous program operation of a plurality of cells, therefore, it is favorable for a file application in which input/output of a large bit count is performed at the same time.

Next, a read operation will be described. The cell to be read is assumed to be the memory cell surrounded by the broken line in FIG. 2 (M13 in FIG. 4). Positive voltages (for instance, 3 V to AG3 and 4 V to AG0) are applied to the assist electrode lines (AG3 and AG0) at both ends of the cell to be read to form the inversion layers (INV 3 and INV 4) at each surface of the silicon substrate (SUB) underneath the assist electrodes (AG3 and AG0). These inversion layers (INV 3 and INV 4) are fed from the diffusion layer regions (L3 and L4) at the ends of the memory mat. The outer assist electrodes lines (AG1 and AG2) are set to be a low voltage (for instance 0 V), which is a level not allowing the formation of an inversion layer, resulting in an electrical isolation being performed. The n-type diffusion layer regions (L3 and L4) are electrically connected to the inversion layers (INV3 and INV4) while forming the inversion layers, and a voltage can be applied from the global data lines (DL3 and DL4) through the contact structure (CT1) provided in the diffusion layer regions (L3 and L4). Herein, the global data line (DL3), which supplies a voltage to the inversion layer (INV3) underneath the assist electrode (AG3) is controlled to be 0 V. Moreover, the global data line (DL4), which supplies a voltage to the inversion layer (INV4) underneath the assist electrode (AG0) at the other end is controlled to be 1.2 V. Herein, whether the memory cell is connected or not is judged by applying a predetermined read voltage to the control electrode (CG).

An erase operation is performed in each word line. Injected electrons are withdrawn to the control electrode side or the substrate side by Fowler-Nordheim tunneling current generated by applying a positive or a negative voltage to the word line.

A problem of such a memory operation is a leakage current especially in the case of programming. As described above, program operation is performed using the trio of assist electrodes and the outer line of the assist electrodes is required to play the role of electrical isolation, thereby, it will be an operation where every four memory cells are programmed to their maximum. For instance, in the case when the memory cell surrounded by the broken line in FIG. 1 is the target to be programmed, it is necessary that the inversion layer (INV4) is formed by applying a high voltage of about 7 V to the assist electrode (AG0), and that this inversion layer (INV4) is controlled to be 4 V via the global data line (DL4). Moreover, it is necessary that the inversion layer (INV2) is formed underneath the assist electrode by applying a voltage of about 4 V to the assist electrode (AG2) and controlled to be 0 V as a memory source. At this time, the inversion layer (INV6) is formed simultaneously, and a voltage of 4 V is also applied between the inversion layer (INV4) and the inversion layer (INV6). Moreover, since a high positive voltage, for instance 15 V, is applied to the control gate (CG), the condition of the surface of the silicon substrate (SUB) underneath the storage nodes (FG4 and FG5) becomes strongly inverted. As a result, the voltages applied to the inversion layers (INV4 and INV 6) are broadened underneath each of the storage nodes (FG4 and FG5) Therefore, it is necessary that the voltage of 4 V applied between the inversion layers by the assist electrode (AG1) be shut down. There is a fear that the voltage (4 V) applied to the inversion layer (INV4) decreases due to a flow of a leakage current underneath this assist electrode (AG1) and that the programming speed to the desired memory cell (the corresponding storage node is FG3) becomes extremely low. At the same time, there is a possibility that field concentration occurs at the surface underneath the boundary between the assist electrode (AG1) and the substrate underneath the storage node (FG4), and the hot electrons created are induced by the electric field generated by the control electrode (CG) in a direction perpendicular to the substrate and are injected into the adjacent storage node (FG4). Accordingly, misprogramming (disturbance) to a memory cell (the corresponding storage node is FG4) which is originally not meant to be programmed occurs.

As described above, in the case when an assist electrode for isolation cannot be sufficiently shut down electrically, spec degradation occurs due to decreased programming speed and misprogramming to the unselected memory cells, therefore, there is a possibility that adequate performance cannot be delivered.

Therefore, it is the objective of the present invention to provide a means which achieves a semiconductor memory device having high-speed programming characteristics in a memory system using a MOS transistor for isolation. Moreover, it is another objective of the present invention to solve the problem of disturbance to the unselected memory cells.

In order to achieve the aforementioned objectives, the present invention is one where the electrical isolation is performed by controlling at least one of the assist electrodes wired in parallel to each other to have a negative voltage and controlling the surface of the semiconductor substrate in the vicinity of the aforementioned assist electrode to be non-conductive in the case of program and read operations.

According to the present invention, in a memory system semiconductor memory device in which a MOS transistor is used for isolation, high-speed programming characteristics can be performed and a reduction in power consumption while programming can be achieved at the same time even if there is high integration. Moreover, highly accurate reading can be achieved in the read operation.

DETAILED DESCRIPTION OF THE PREFERRED EMBODIMENTS

The following is a detailed description of a semiconductor memory device of the present invention with concrete embodiments.

First Embodiment

Figure 5:
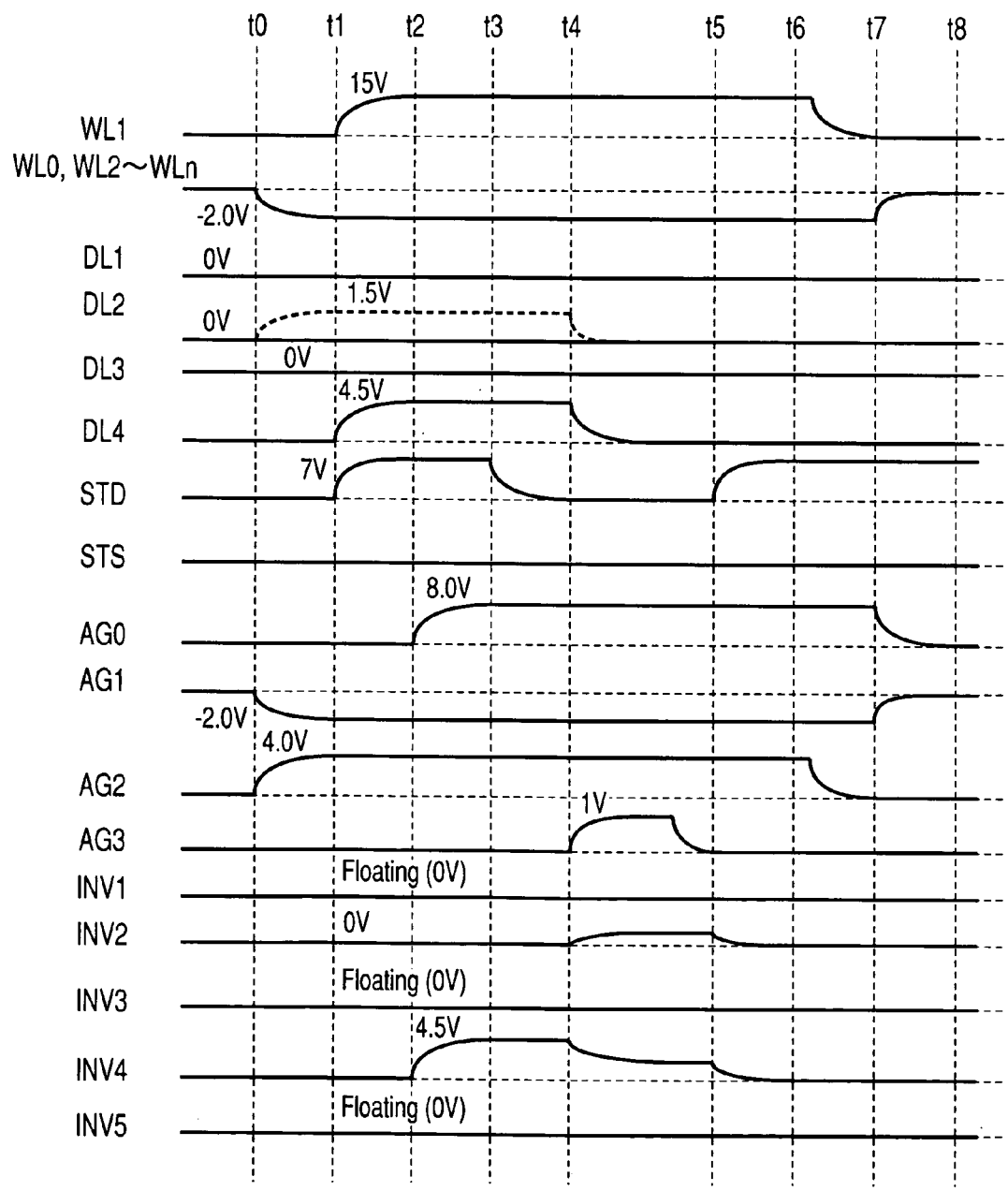
FIG. 5 is a timing chart of a program operation of a memory cell array of a semiconductor memory device of the first embodiment.

First embodiment of the present invention will be described by using FIGS. 1 to 9. FIG. 5 shows a program operation sequence described in this embodiment. When a programming command is input from ROM outside, an instruction command is read from the inside of the chip and a program operation is executed automatically. FIG. 5 shows a program operation to the memory cell (M13) shown in FIG. 4. Table 1 shows the correspondence between memory cell threshold voltages (Vth) and programming information.

TABLE 1

| Programming word voltage | Range of threshold voltages (Vth) |
|---|---|
| '01' Vww3 | Vth > V3 |
| '00' Vww2 | V2L < Vth < V2H |
| '10' Vww1 | V1L < Vth < V1H |
| '11' Vww0 | V0L < Vth < V0H |

Herein, the relationship is V3 > V2H > V2L > V1H > V1L > V0H > V0L.

Another way of correspondence may be acceptable between this two-bit information such as "0" and "1" and the threshold voltage level. In this embodiment, it is assumed that programming is carried out, in order, from a higher threshold voltage level although any order can be taken for the order of programming threshold voltage level.

In the case when the information desired to be programmed in the target memory cell (M13) is "01", first, unselected word lines (WL0, WL2 to WLn) in the same string is controlled to be a low negative voltage, for instance −2 V at the timing (t0). And, the assist electrode line (AG2) is controlled to be 4 V to form the inversion layer line (INV2) at the surface of the silicon substrate (SUB) underneath the assist electrode line (AG2). At the same time, a low negative voltage, for instance −2 V, is applied to the assist electrode line (AG1) located between the memory cell (M14) and the memory cell (M15). It is possible to reliably make a cut off between the memory cell (M14) and the memory cell (M15) by applying a negative voltage to the assist electrode line (AG1).

Then, the selected word line (WL1) is controlled to be a positive high voltage, for instance 15 V, at the timing (t1). At the same time, the data line (DL4) is controlled to be a drain voltage while programming, for instance 4.5 V, and the gate signal (STD) of the selected transistor is controlled to be about 7 V. At this time, data line (DL2) is connected to the inversion layer wiring (INV2) and the inversion layer wiring (INV2) is controlled to be 0 V, which is the same voltage as the data line (DL2).

Afterwards, at the timing (t2), a medium level high voltage, for instance 8 V, is applied to the assist electrode line (AG0) arranged at the drain side of the memory cell (M13), thereby, the condition of the surface of the silicon substrate (SUB) right underneath the assist electrode line (AG0) becomes strongly inverted, resulting in the inversion layer wiring (INV4) being formed. Since this inversion layer wiring (INV4) is connected to the data line (DL4) through the selected transistor, it is charged to 4.5 V.

After the inversion layer wiring (INV4) is charged to 4.5 V, the gate signal (STD) of the selected transistor is deactivated at the timing (t3), and the inversion layer wiring (INV2) and the inversion layer wiring (INV4) are made floating under the conditions of 0 V and 4.5 V, respectively.

Then, the assist electrode line (AG3) is controlled to be a positive low voltage, for instance 1 V, at the timing (t4), thereby, the condition of the surface of the silicon substrate (SUB) underneath the assist electrode line (AG3) becomes a weakly inverted. Since each memory cell (M12), assist electrode line (AG3), and memory cell (M13) are in an ON state, the space between the inversion layer wiring (INV2) and the inversion layer wiring (INV4) is brought into conduction. At this time, charge transfers between the inversion layer wiring (INV2) and the inversion layer wiring (INV4) until they reach an equilibrium state. Concretely, electrons of the inversion layer wiring (INV2) which is in a floating state transfer to the inversion layer wiring (INV4) which is similarly in a floating state. Field concentration occurs at the boundary of the weak inversion region underneath the assist electrode line (AG3) and the inversion layer underneath the memory cell (M13), resulting in hot electrons being created. The hot electrons created are induced by the electric field generated by the voltage of the selected word line (WL1) in a direction perpendicular to the substrate and are injected into the storage node (FG3) of the adjacent memory cell (M13). Since the electrical resistance of the weak inversion region underneath the assist electrode line (AG3) is high, the current that flows between the inversion layer wiring (INV2) and the inversion layer wiring (INV4) is not so large, so that the ratio of the injected electrons to the storage node can be made greater considering the flowing current. Accordingly, the current does not become too large, even during the simultaneous program operation of a plurality of cells, therefore, it is favorable for a file application in which input/output of a large bit count is performed at the same time.

Programming is complete by deactivating the assist electrode line (AG3) at the timing (t5). After programming, the gate signal (SDT) of the selected transistor is controlled to be about 7 V, and the data lines (DL4 and DL2) are connected to the inversion layer wirings (INV4 and INV2), respectively. The data line (DL4) is discharged to 0 V at the timing (t4), so that both inversion layer wirings (INV4 and INV2) are controlled to be 0 V.

Then, the selected word line (WL1) is deactivated to 0 V at the timing (t6) and the assist electrode line (AG2) is controlled to be 0 V.

Finally, at the timing (t7), the program operation is complete by deactivating the unselected word lines (WL0, WL2 to WLn) and the assist electrode line (AG1) to be from negative voltages to 0 V, and by deactivating the assist electrode line (AG0) to be 0 V from 8 V.

The above description is a case where the information desired to be programmed in the target memory cell (M13)

is "01". However, in the case when the desired programming information is not "01", a voltage for program protection, for instance 1.5 V, is applied to the data line (DL2) at the timing (t0). Accordingly, the assist electrode line (AG3) does not become an ON state because it is 1 V which is lower than 1.5 V although the memory cell (M12) and the memory cell (M13) are in an ON state, so that conduction cannot take place between the inversion layer wiring (INV2) and the inversion layer wiring (INV4). Therefore, charge injection does not occur.

Then, a read operation is carried out, and whether the threshold voltage of memory cell (M13) is controlled to be higher than V3 is verified. Details of the read operation will be described later. In the case when the information desired to be programmed is "01" and the threshold voltage is not higher than V3, the program operation shown in FIG. 5 is carried out again to apply a programming pulse to the memory. Then, the sequence of doing a read verification operation again and applying a programming pulse, if necessary, is repeated. A program operation is performed with one of four memory cells in this array structure, and the "01" programming sequence is complete when all these target cells for programming pass the verification.

Next, it moves to the "00" programming sequence. In this case, if the information desired to be programmed to the target cell for programming is also "00", the data line (DL2) is controlled to be 0 V. Otherwise, the program protection voltage is controlled to be, for instance 1.5 V. The voltage setting of each part may be the same as that for "01" programming, but a lower voltage than the case of "01" programming, for instance 13 V, is used for the selected word line (WL1). As a result, the voltage which induces hot electrons to the storage node drops even if the same pulse width as the case of "01" programming is used, so that the injected charge is less and programming to a lower threshold voltage level is possible. Verification is performed at the same time, but the difference is the point that it is necessary to control the threshold voltage to be higher than V2L and lower than VH2. Here, the first programming pulse may be set so as not to inject too much charge and to make the pulse width smaller for the second and subsequent times to prevent excess charge injection. The "00" programming sequence is complete when all these target cells for programming pass the verification, and it moves to the "10" programming sequence.

The "10" programming is the same operation as the "00" programming except for controlling the voltage of the selected word line (WL1) to be a lower voltage than the case of "00" programming, for instance 12 V, and the target threshold voltage level being different. Then, the program operation is complete after the "01" programming sequence is done.

Herein, in each programming of information, the programming pulse voltage applied to the word line was assumed to be constant throughout the sequence. However, the programming sequence can be complete in a shorter time by using a pulse train in which a higher voltage is applied with increasing number.

Figure 6:
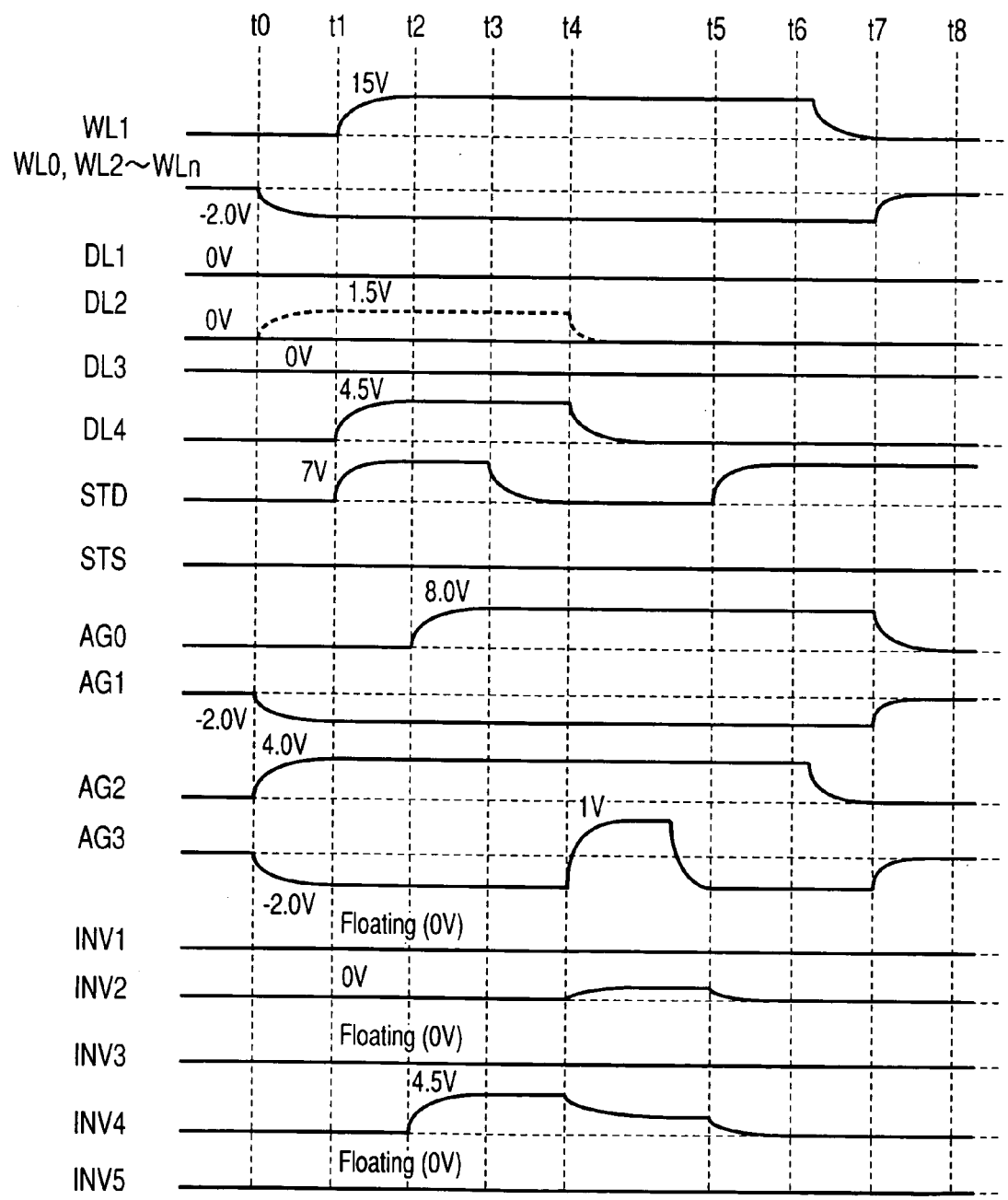
FIG. 6 is a timing chart of a program operation of a memory cell array of a semiconductor memory device of the first embodiment. The operation of the assist electrode line is different from FIG. 5

Moreover, in FIG. 5, the assist electrode line (AG3) is controlled to be 0 V as the base level and 1 V while programming. As shown in FIG. 6, the sequence may be taken in which it is controlled once to be a negative voltage, about −2 V, at the timing (t0) and then activated to be 1 V while programming. In this case, the assist electrode line (AG3) can be reliably made a cut-off during the period until programming is started at the timing (t4) after controlling the inversion layer wiring (INV4) to be 4.5 V. Specifically, the leakage current, which flows through the assist electrode line (AG3) before programming is started, can be controlled, so that there is an effect that a reduction in the programming speed can be suppressed.

Next, a read operation will be described by using FIG. 7. Information in the memory cell (M13) which was programmed in the aforementioned description of a program operation will be read. First, at the timing (t0), a voltage Vread which is needed for reading or to verify timing is applied to the selected word line (WL1). At the same time, 0 V or a negative voltage, for instance −2 V, is applied to the unselected word lines (WL0, WL2 to WLn). Since the unselected word lines have already been controlled to be 0V or a negative voltage, for instance −2 V, it is not necessary to control the voltage of unselected word lines again while verifying after applying a programming bias voltage. As a result, it is possible to control an unnecessary leakage current in the memory cell on the unselected word lines, resulting in highly accurate reading being achieved. Moreover, a negative voltage, for instance −2 V, is applied simultaneously to the assist electrode lines (AG1 and AG2). As a result, it becomes possible to suppress a leakage current flowing thorough the memory cell (M14) which is adjacent to the selected memory cell (M13) on the same word line, resulting in highly accurate reading being achieved.

Then, at the timing (t2), the assist electrode lines (AG0 and AG3) are controlled to be a positive voltage of about 4 V to form the inversion layer wirings (INV4 and INV3) at the surface of the silicon substrate (SUB) underneath the assist electrode lines (AG0 and AG3), respectively.

Then, at the timing (t3), the data line (DL4) is pre-charged to be a positive voltage of about 1.2 V to make the data line (DL4) a floating state. At this time, the inversion layer wiring (INV4) is also pre-charged to be 1.2 V together with the data line (DL4).

At the timing (t4), the gate signal (STS) of the selected transistor is activated to be a positive voltage of about 5 V. Then, the inversion layer wiring (INV3) is connected to the data line (DL3) and the inversion layer wiring (INV3) becomes 0 V. Here, in the case when the threshold voltage of the memory cell (M13) is lower than the voltage Vread applied to the selected word line, the memory cell (M13) becomes ON state, and a current flows from the data line (DL4) to the data line (DL3) through the inversion layer wiring (INV4), the memory cell (M13), and the inversion layer wiring (INV3). Since the data line (DL4) is in a floating state, the prior pre-charged voltage of 1.2 V is decreased. On the other hand, in the case when the threshold voltage of the memory cell (M13) is higher than the voltage Vread applied to the selected word line, the memory cell (M13) becomes an OFF state, and the voltage applied to the data line (DL4) is kept in the pre-charged voltage of 1.2 V. After a predetermined time, the gate signal (STD) of the selected transistor is deactivated to be 0 V at the timing (t5), the inversion layer wiring (INV4) is disconnected from the data line (DL4), and the state of the data line (DL4) is discriminated by using a sense amplifier at the subsequent timing (t6).

In order to discriminate the four threshold voltage levels, it is discriminated whether the level is higher than the threshold voltage level of "00", that is, higher than V2L, or less than the level of "10", that is, lower than V1H. For this, a voltage Vrw1, where V1H<Vrw1<V2L, is applied to the selected word line (WL1). If the threshold voltage level of the memory cell (M13) is lower than V1H, the memory cell (M13) becomes a conductive state, and the data line (DL4) is discharged to be 0 V. Moreover, if the threshold voltage level of the memory cell (M13) is higher than V2L, the memory cell (M13) becomes a nonconductive state or a high resistance state, and the data line (DL4) keeps the precharged voltage of 1.2 V. The discrimination whether the upper bit is "0" or "1" is performed by using the difference of the states of the data line (DL4). If the result is lower than V1H, a voltage Vrw0, where V0H<Vrw0<V1L, is applied to the selected word line (WL1) in the subsequent read operation to discriminate whether it is "11" or "10" by using the difference of the flowing currents. In the case when the reading result is higher than V2L, the voltage applied to the selected word line (WL1) is controlled to be Vrw2, where V2H<Vrw2<V3. The discrimination whether it is "00" or "01" is performed by using the difference of flowing currents.

In the aforementioned read operation, without changing the following applied voltage conditions according to the results using Vrw1, it is also possible for reading information to use a means where all read operations are carried out using Vrw0, Vrw1, and Vrw2. While the former is suitable for increasing speed because the read voltage is applied twice, the latter has the feature that the control circuit can be simplified in spite of the fact that read operations need to be done three times.

Figure 7:
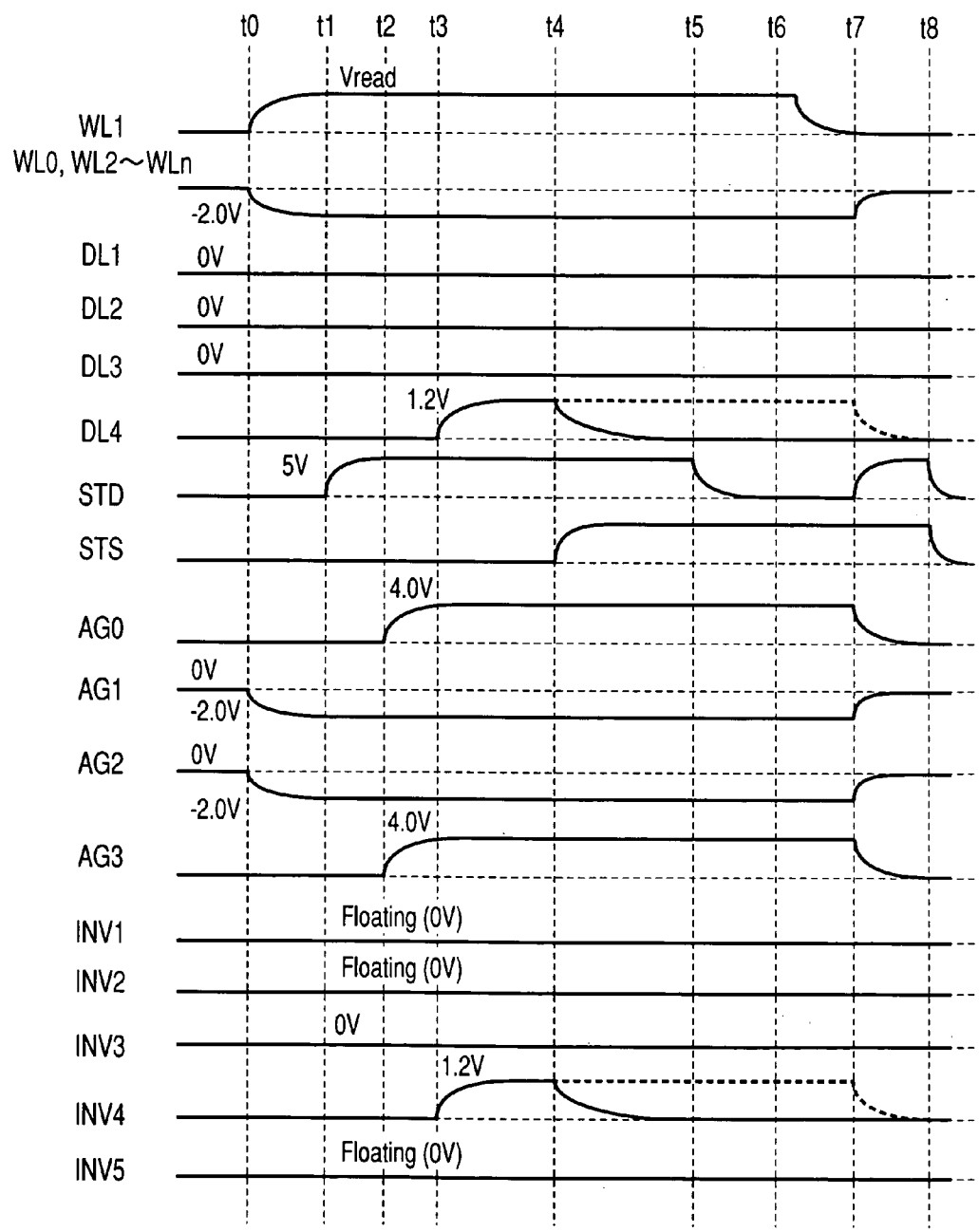
FIG. 7 is a timing chart of a read operation of a memory cell array of a semiconductor memory device of the first embodiment.
Figure 8:
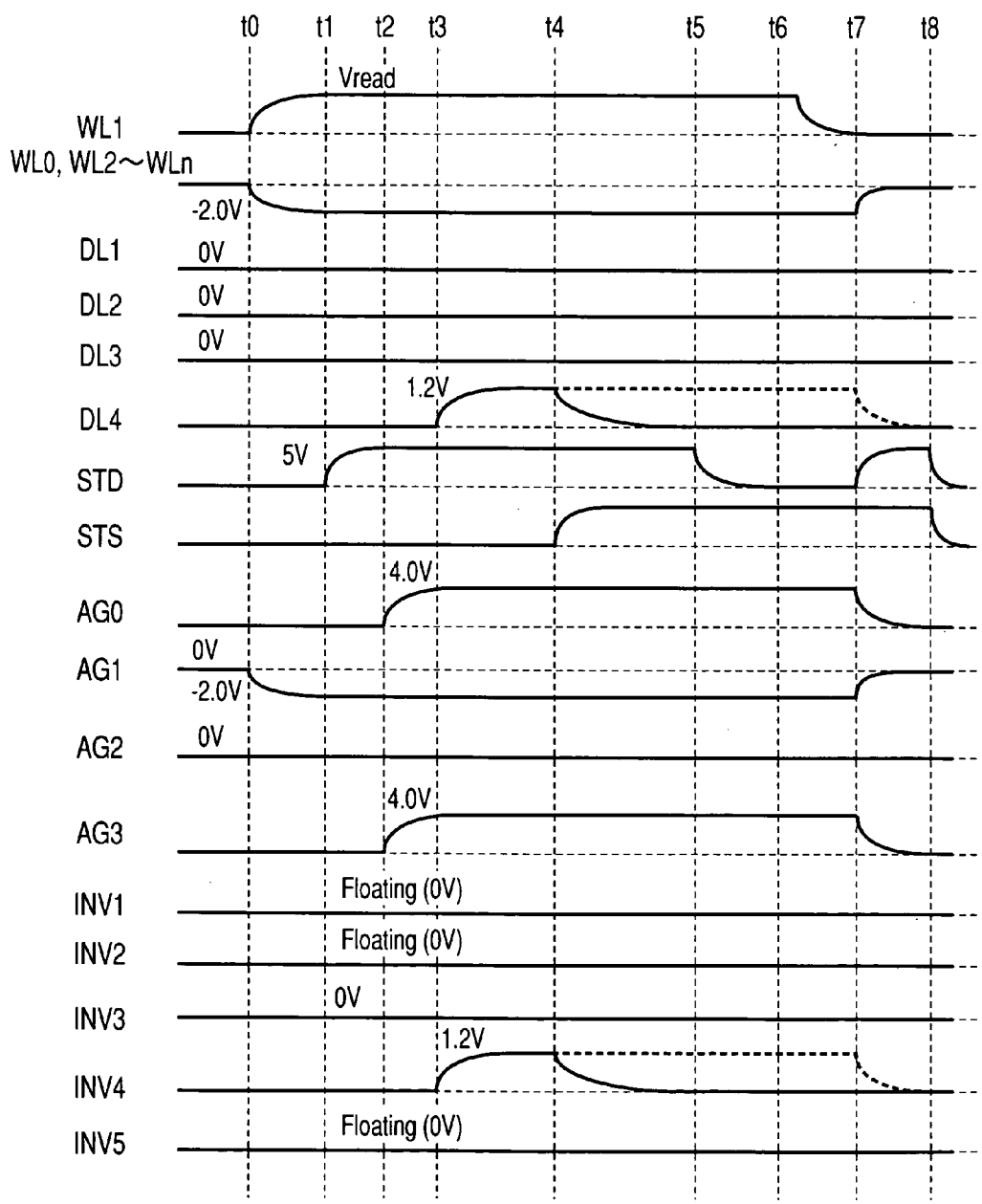
FIG. 8 is a timing chart of a read operation of a memory cell array of a semiconductor memory device of the first embodiment. The operation of the assist electrode line is different from FIG. 5.

FIG. 7 explained the case when both assist electrode lines (AG1 and AG2) which were not the reading paths were controlled to be a negative voltage at timing (t0), for instance, −2 V. Reading may be performed by controlling only the assist electrode line (AG1) to be a negative voltage, for instance −2 V, and maintaining the assist electrode line (AG2) at 0 V, as shown in FIG. 8. Accordingly, in the case when the verify reading is performed right after the program operation described in FIG. 5, only the assist electrode line (AG1) can be controlled to be a negative voltage, for instance −2 V, following the program operation, so that there is the effect that the overhead time can be reduced during the verify reading.

Figure 9:
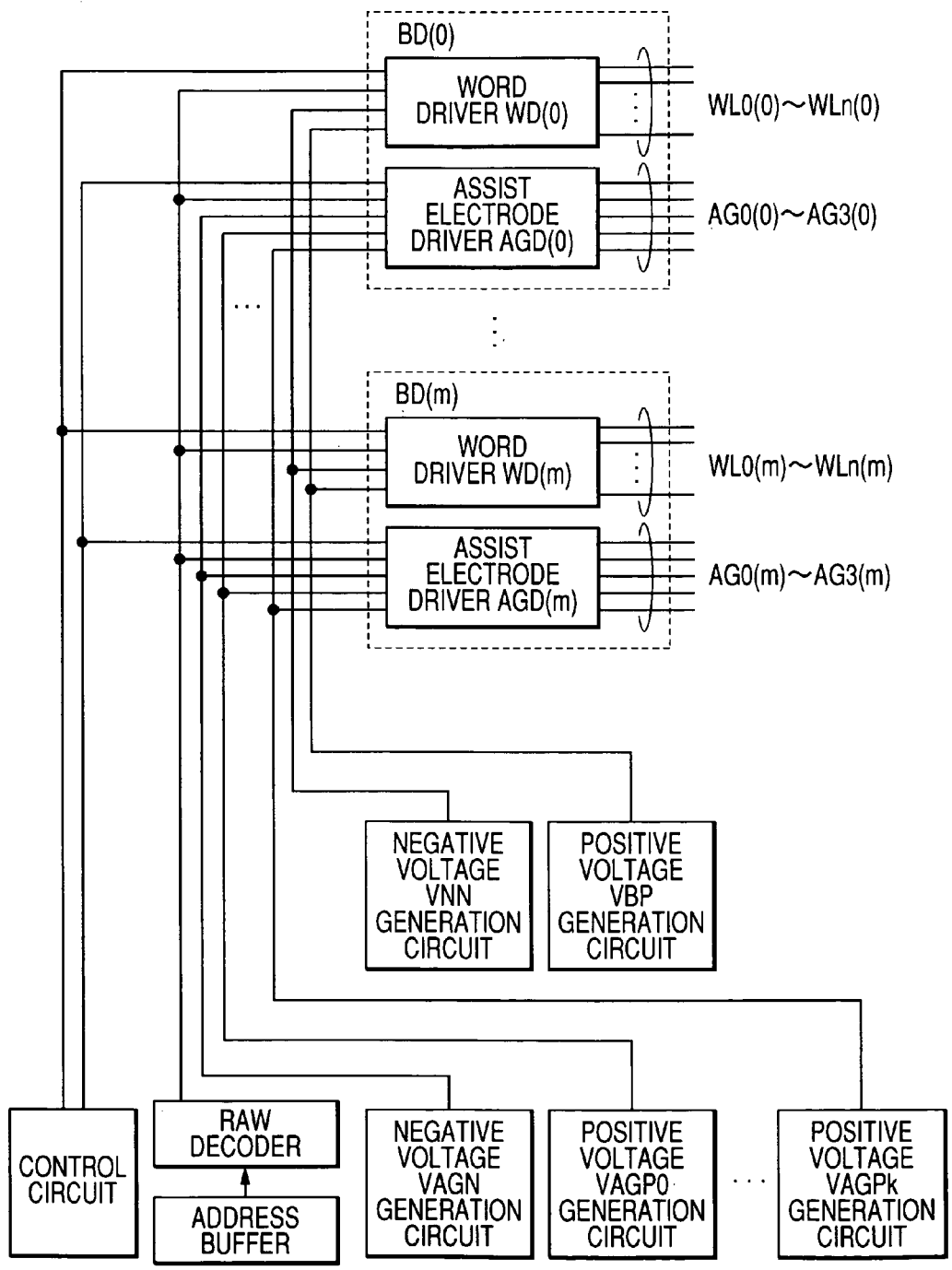
FIG. 9 is a circuit block configuration illustrating a word driver and an assist electrode driver of a semiconductor memory device of the first embodiment.

FIG. 9 is a drawing illustrating a configuration of word drivers and assist electrode line drivers of this embodiment. Block decoders (BD(0) to BD(m)) are provided corresponding to the m+1 memory blocks, and each block decoder (BD(0) to BD(m)) consists of the word drivers (WD(0) to WD(m)) and the assist electrode line drivers (AGD(0) to AGD(m)).

The word drivers (WD(0) to WD(m)) have the signal from the control circuit, the address information output from the address buffer through the RAW decoder, the output (VBP) from the positive voltage generation circuit which is an internal power supply, and the output (VNN) from the negative voltage generation circuit as the input. Moreover, the assist electrode line drivers (AGD(0) to AGD(m)) have the signal from the control circuit, the address information output from the address buffer through the RAW decoder, the output (VAGP0 and VAGPk) from a plurality of the positive voltage generation circuits which are the internal power supply, and the output (VAGN) from the negative voltage generation circuit as the input. Furthermore, even though it is not shown in the figure, both of the word drivers (WD(0) to WD(m)) and the assist electrode line drivers (AGD(0) to AGD(m)) have a supply voltage VCC and a ground level voltage VSS as the input.

The word drivers (WD(0) to WD(m)) control the word lines (WL0(0) to WLn(0), and WL0(m) to WLn(m)) in the corresponding memory blocks, and the assist electrode line drivers (AGD(0) to AGD(m)) control the assist electrode lines (AG0(0) to AG3(0), and AG0(m) to AG3(m)) in the corresponding memory blocks. Foe instance, the word driver (WD(0)) in the block decoder (BD(0)) controls the word lines ((WL0(0) to WLn(0)) in the 0th memory block. Similarly, the assist electrode line driver (AGD(0)) in the block decoder (BD(0)) controls the assist electrode lines (AG(0) to AG3(0)) in the 0th memory block. Moreover, the word driver (WD(m)) in the block decoder (BD (m)) controls the word lines ((WL0(m) to WLn (m)) in the mth memory block, and the assist electrode line driver (AGD(m)) in the block decoder (BD(m)) controls the assist electrode lines (AG0(m) to AG3(m)) in the mth memory block. Predetermined positive and negative voltages can be applied to the selected memory block by using such a block decoder having the word driver and the assist electrode line driver.

The above was explained on the precondition that the storage node consists of a continuous film of polycrystalline silicon, but the storage node may be composed of a plurality of fine particles. Moreover, the storage node may be composed of a plurality of fine particles of other semiconductor and metallic materials. Moreover, fine particles consisting of an insulating material having a charge trap may also be used. If the fine particles are used, the storage nodes are insulated from each other, so that it is not necessary to separate each other by patterning like a storage node composed of a continuous film of polycrystalline silicon. As a result, it has the feature that patterning becomes easier and the process margin increases. Moreover, since such process simplicity can be obtained even if an insulator film such as SiN which has a trap is employed, this may also be used. Etching of SiN is possible, in which SiN has a selection ratio against a $SiO_2$ film, and it has superior characteristics with respect to patterning compared with a fine particle charge trapping region. On the other hand, the fine particle charge trapping region can be surrounded by the other insulating material such as $SiO_2$ which does not have a trap, so that it is generally possible to select a material in which charge transfer hardly occurs and it has excellent retention properties. As a result, it is suitable for multilevel storage having a small threshold margin. Therefore, it is preferable for applications in which a plurality of information is stored by injected charge and where it is desirable to suppress the fluctuation in properties. Moreover, a nitrogen-doped $SiO_2$ film may be used for the interpoly film between the storage node and the word line in lieu of a $SiO_2$ film. It has the feature that the trap is not created easily compared with a simple $SiO_2$ film in the case of programming/erasing and the fluctuation in properties is small. Moreover, a stacked structure of $SiO_2$ and silicon nitride film may be taken. Such a stacked structure also has the feature that a current does not flow relatively easily while applying a high electric field and the memory element has excellent reliability. The above descriptions about the configuration of the charge trapping region and the configuration of the interpoly film are all similar in other embodiments.

Second Embodiment

The second embodiment of the present invention will be described by using FIGS. 10 to 15.

Figure 3:
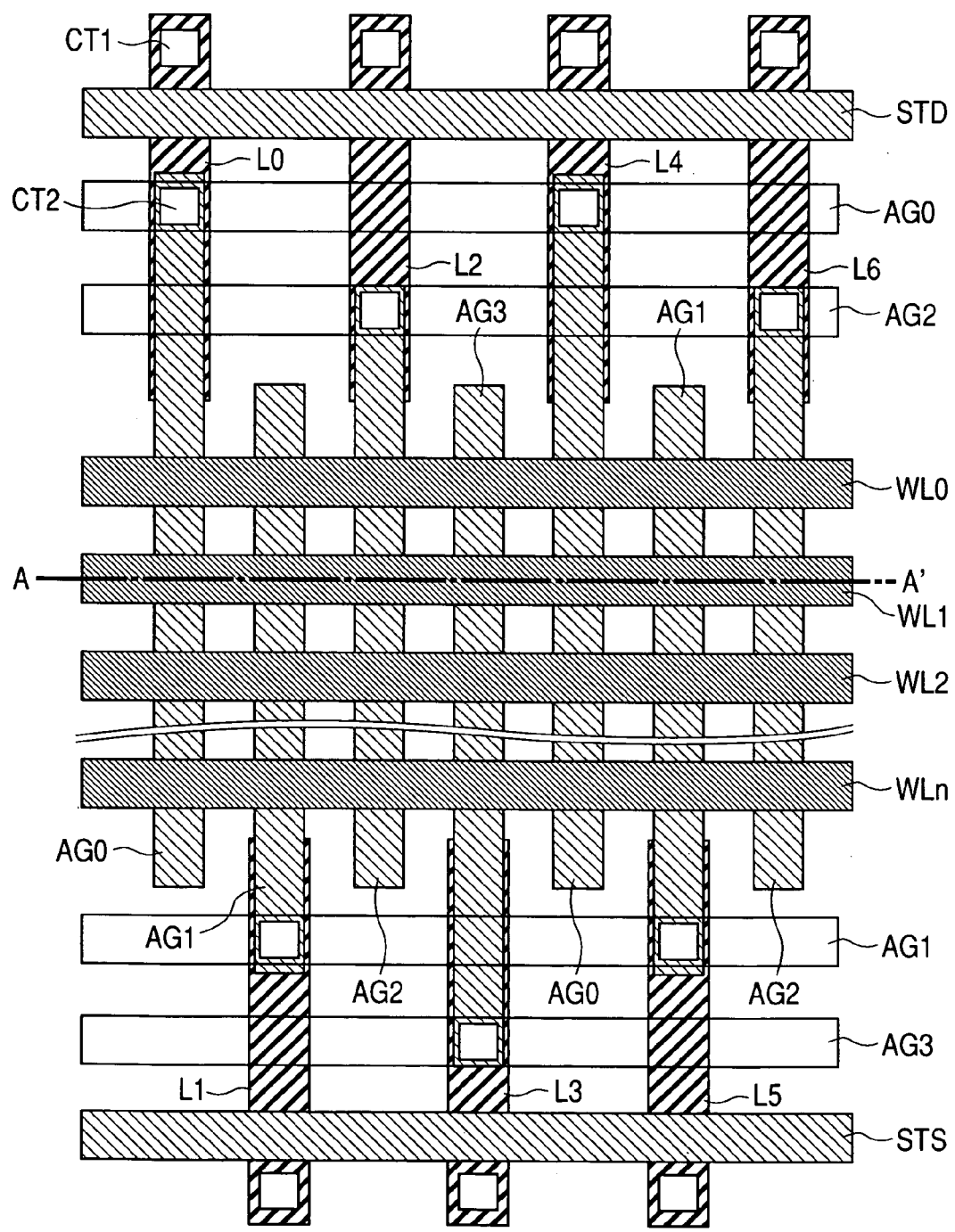
FIG. 3 is a top view of a memory cell mat part of a semiconductor memory device of the first embodiment.
Figure 4:
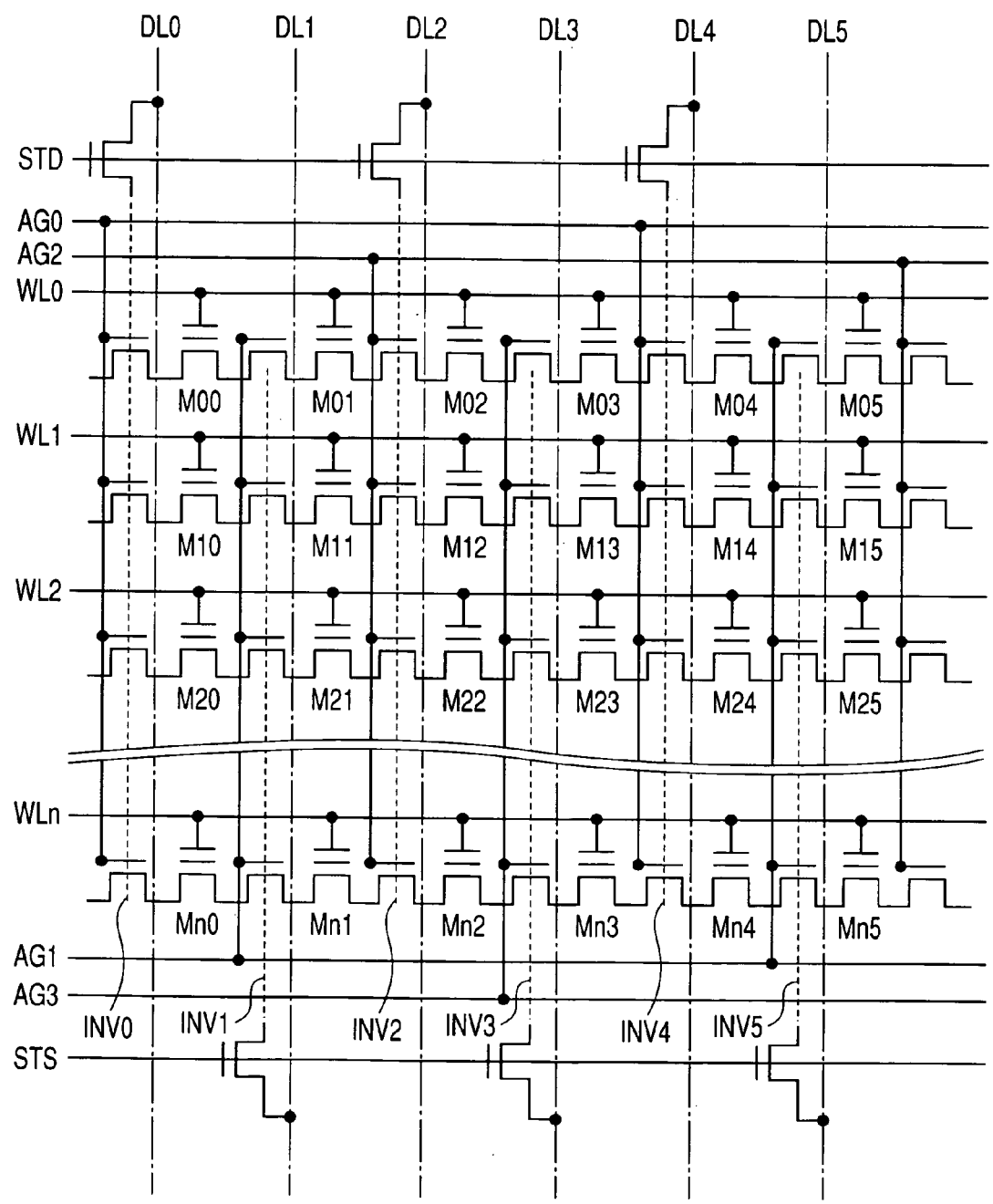
FIG. 4 is an equivalent circuit drawing of a memory cell array of a semiconductor memory device of the first embodiment.
Figure 10:
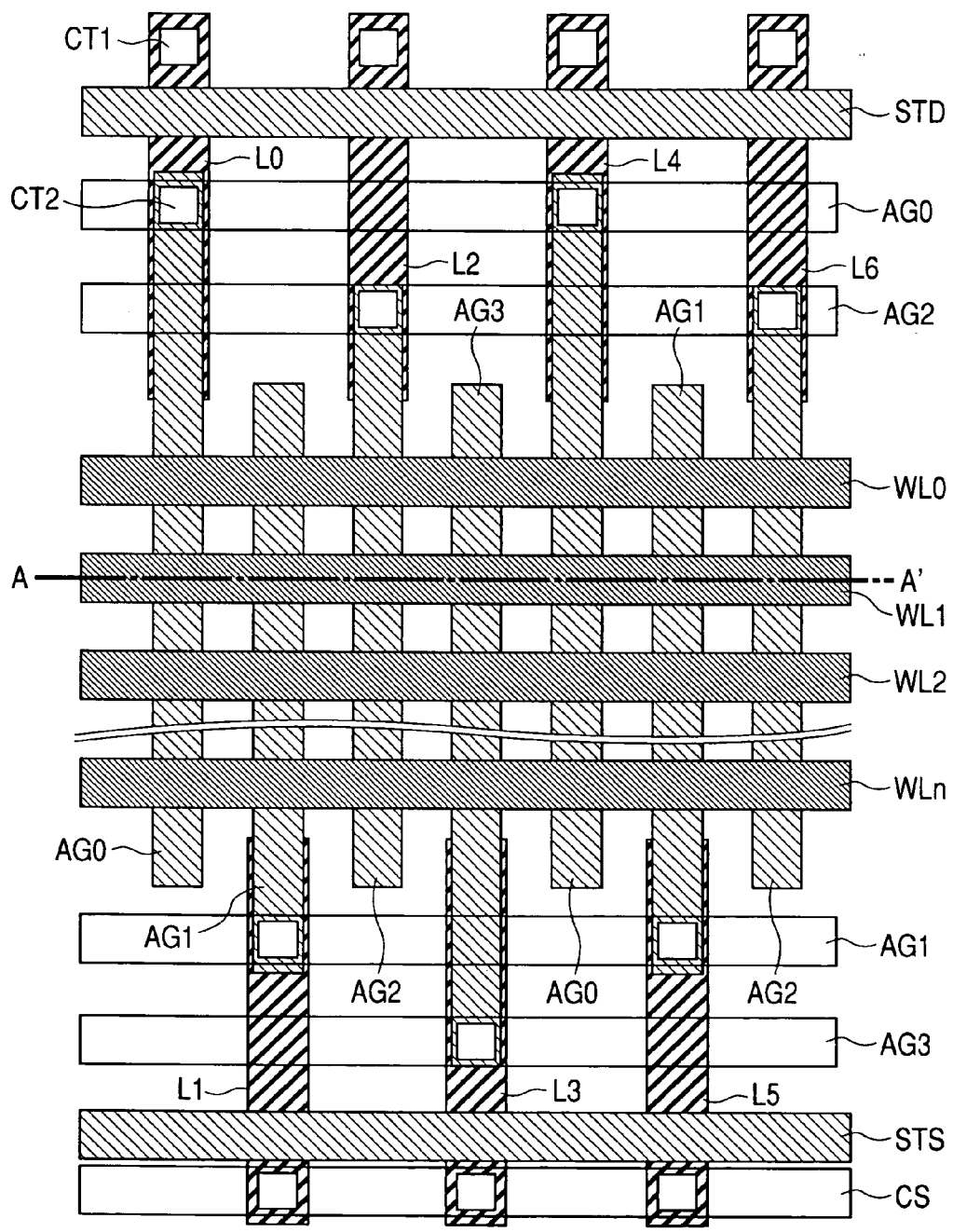
FIG. 10 is a top view of a memory cell mat part of a semiconductor memory device of the second embodiment.
Figure 11:
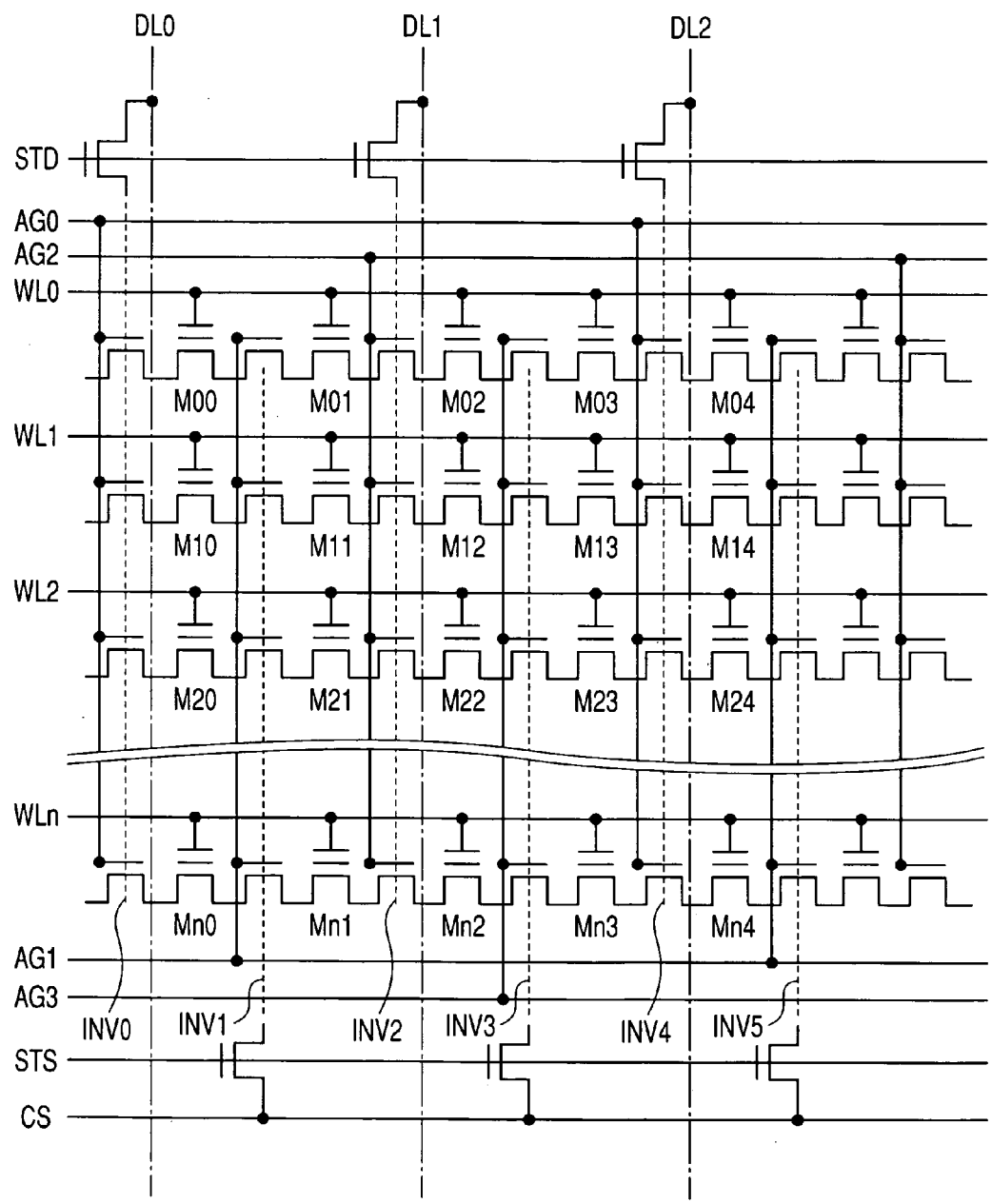
FIG. 11 is an equivalent circuit drawing of a memory cell array of a semiconductor memory device of the second embodiment.

FIG. 10 is a top view of a memory mat and FIG. 11 is an equivalent circuit thereof. The difference in FIG. 10 from FIG. 3 is that the diffusion layer regions (L1, L3 and L5) are connected to the common source wiring (CS) through the selected transistor. Such a memory array arrangement makes it possible for one data line to be arranged to two local bit lines, resulting in the layout pitch of the data line being made wider. Moreover, since the spacing between the data lines can be made wider, it has the effect that the capacitance between the data lines can be reduced and the coupling noise between the data lines can be suppressed.

Figure 12:
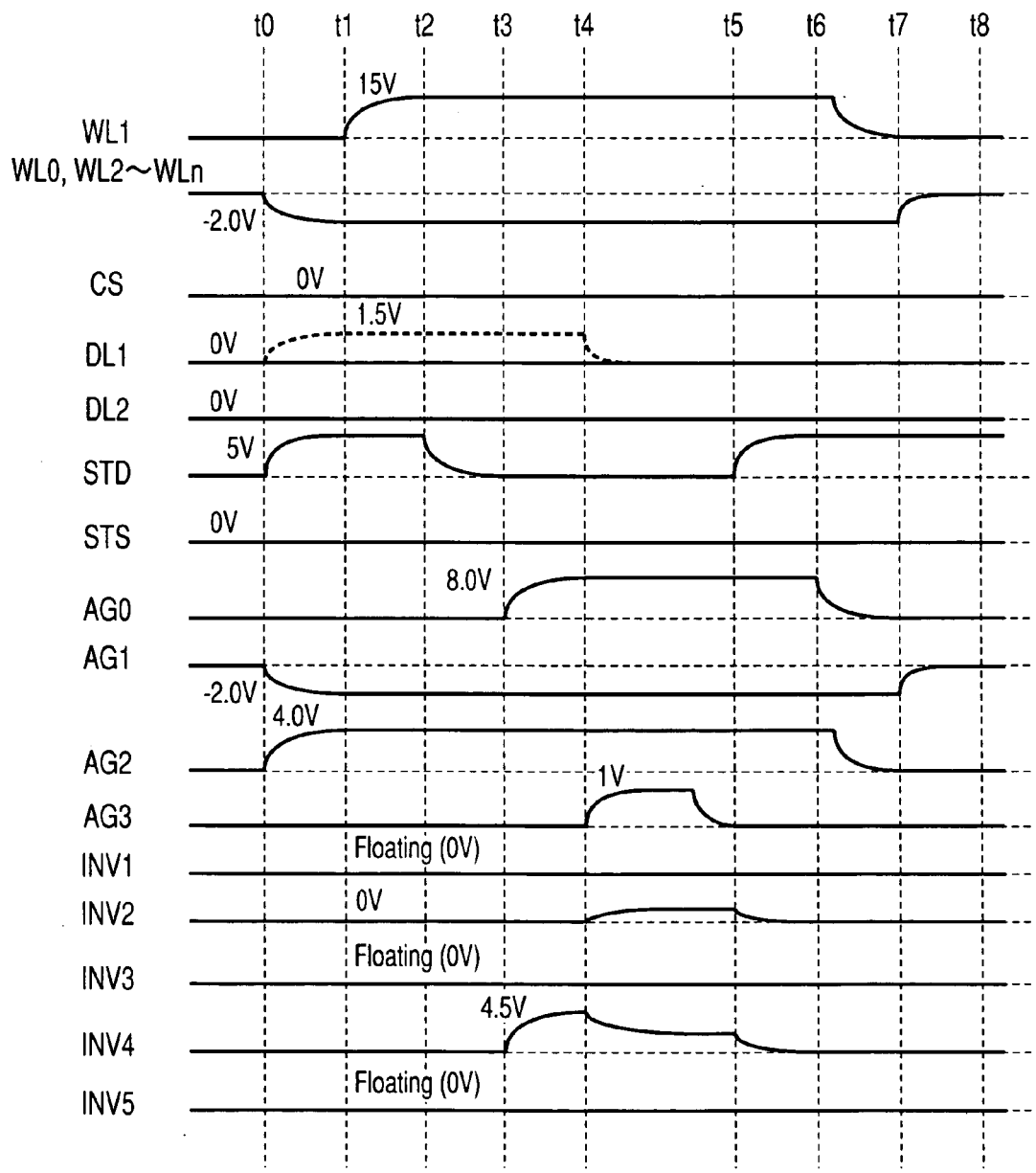
FIG. 12 is a timing chart of a program operation of a memory cell array of a semiconductor memory device of the second embodiment.

The program operation to the memory cell (M13) in this memory array will be described. The basic operations are the same except that the memory array has a common source line (CS) FIG. 12 shows a sequence of a program operation. Table 1 shows the correspondence between the threshold voltages and information, with the relationship being V3>V2H>V2L>V1H>V1L>V0H>V0L. Another way of correspondence may be acceptable between this two-bit information such as "0" and "1" in Table 1 and the threshold voltage level. In this embodiment, it is assumed that programming is carried out, in order, from higher threshold voltage levels, although any order can be taken for the order of programming threshold voltage level.

In the case when the information desired to be programmed in the target memory cell (M13) is "01", first, the unselected word lines (WL0, WL2 to WLn) in the same string are controlled to be a low negative voltage, for instance −2 V at the timing (t0). The assist electrode line (AG2) is controlled to be 4 V to form the inversion layer line (INV2) at the surface of the silicon substrate (SUB) underneath the assist electrode line (AG2). At the same time, a low negative voltage, for instance −2 V, is applied to the assist electrode line (AG1) located between the memory cell (M14) and the memory cell (M15). It is possible to make a reliable cut-off between the memory cell (M14) and the memory cell (M15) by applying a negative voltage to the assist electrode line (AG1). At the timing (t0), the gate signal (STD) of the selected transistor is also controlled to be about 5 V. Accordingly, the inversion layer wiring (INV2) is connected to the data line (DL1) and the voltage of the inversion layer wiring (INV2) is controlled to be 0 V, which is the same as the data line (DL1).

Then, at the timing (t1), the selected word line (WL1) is controlled to be a high positive voltage, for instance 15 V.

After this, at the timing (t2), the gate signal (STD) of the selected transistor is deactivated from 5 V to 0 V to disconnect the inversion layer wiring (INV2) from the data line (DL1). The inversion layer wiring (INV4) is disconnected from the data line (DL2) by making the gate signal (STD) of the selected transistor 0 V, resulting in the inversion layer wiring (INV4) being in a floating state.

Then, at the timing (t3), when a high positive voltage, for instance 8 V, is applied to the assist electrode line (AG0), the voltage at the surface of the Si substrate underneath the assist electrode line (AG0) is automatically increased. This is an effect of coupling between the capacitance of the gate oxide film existing at the space between the assist electrode and the silicon substrate (SUB) and the capacitance of the depletion layer created underneath the silicon substrate (SUB). When a voltage of 8 V is applied to the assist electrode line (AG0), the surface of the silicon substrate (SUB) right underneath the assist electrode line (AG0), that is, the inversion layer wiring (INV4) is increased to be about 4.5 V. This is enough voltage for the aforementioned source-side-injection programming.

Then, at timing (t4) the assist electrode line (AG3) is activated to be about 1 V. Accordingly, the inversion layer wiring (INV4) activated to be about 4.5 V is connected to the inversion layer wiring (INV2), which is controlled to be 0 V, through the memory cell (M13). Since the gate signal (STD) of the selected transistor is controlled to be 0 V, both the inversion layer wiring (INV4) and the inversion layer wiring (INV2) are disconnected from the data lines (DL2) and (DL1), resulting in their being in a floating state. Therefore, there is a transfer of charge between the inversion layer wiring (INV4) and the inversion layer wiring (INV2) until an equilibrium state is reached. At this time, electric field concentration occurs at the boundary between the weak inversion region underneath the assist electrode (AG3) and the inversion layer underneath the memory cell (M13), resulting in hot electrons being created. The hot electrons created are induced by the electric field generated by the voltage of the selected word line (WL1) in a direction perpendicular to the substrate and are injected into the storage node of the adjacent memory cell (M13). Here, since the resistance of the weak inversion region underneath the assist electrode line (AG3) is high, the current flowing between the inversion layer wiring (INV2) and the inversion layer wiring (INV4) is not so large, so that the ratio of the injection electrons to the storage node can be made greater considering the flowing current. Accordingly, the current does not become too great even during the simultaneous program operation of a plurality of cells; therefore, it is favorable for a file application in which input/output of a large bit count is performed at the same time. Moreover, the charge flowing underneath the memory cell (M13) depends on the voltage which is an increased voltage of the inversion layer wiring (INV4) by activating the assist electrode line (AG3), but the charge is almost constant. Therefore, the injected charge to the storage node of the memory cell (M13) becomes almost constant, with the result that a variation of the programming characteristics between the cells can be reduced.

Programming is complete by deactivating the assist electrode line (AG3) at the timing (t5). After programming, the gate signal (STD) of the selected transistor is controlled to be about 5 V; the data lines (DL2 and DL1) are connected to the inversion layer wirings (INV4 and INV2), respectively; and the inversion layer wirings (INV4 and INV2) are controlled to be 0 V. Then, the selected word line (WL1) is deactivated to 0 V at the timing (t6) and the assist electrode lines (AG2) and (AG0) are controlled to be 0 V. Finally, at the timing (t7), the program operation is complete by controlling the unselected word lines (WL0, WL2 to WLn) and the assist electrode line (AG1) to be 0 V from negative voltages.

What was described above is a case where the information desired to be programmed in the target memory cell (M13) is "01". However, in the case when the information desired to be programmed is not "01", a voltage to preventing programming, for instance 1.5 V, is applied to the data line (DL1) at the timing (t0). Accordingly, the assist electrode line (AG3) does not become ON state because it is 1 V, which is lower than 1.5 V, although the memory cell (M12) and the memory cell (M13) are ON state, so that conduction cannot take place between the inversion layer wiring (INV2) and the inversion layer wiring (INV4). Therefore, charge injection does not occur.

Then, the read operation is carried out, and whether the threshold voltage of memory cell (M13) is controlled to be higher than V3 is then verified. Details of the read operation will be described later. In the case when information desired to be programmed is "01" and the threshold voltage of the memory cell (M13) is not higher than V3, the program operation shown in FIG. 12 is carried out again to apply a programming pulse to the memory cell. Then, the sequence of doing a read verification operation again and the application of a program pulse, if necessary, is repeated. Program operation is performed to one of four memory cells in this array structure, and the sequence is complete when all these target cells for programming pass the verification.

Next, it moves to the "00" programming sequence. In this case, if information desired to be programmed to the target cell for programming is also "00", the data line (DL2) is controlled to be 0 V. Otherwise, the program protection voltage is controlled to be, for instance 1.5 V. The voltage setting of each part may be the same as that for "01" programming, but a lower voltage than the case of "01" programming, for instance 13 V, is used for the selected word line (WL1). As a result, the voltage which induces hot electrons to the storage node drops even if the same pulse width as the case of "01" programming is used, so that the injected charge is less and programming to a lower threshold voltage level is possible. Verification is performed at the same time, but the difference is the point that it is necessary to control the threshold voltage to be higher than V2L and lower than V2H. Here, the first programming pulse may be set so as not to inject too much charge and to make the pulse width smaller for the second and subsequent times to prevent excess charge injection. The "00" programming sequence is complete when all these target cells for programming pass the verification, and it moves to the "10" programming sequence.

The "10" programming is the same operation as the "00" programming except for controlling the voltage of the selected word line (WL1) to be a lower voltage than the case of "00" programming, for instance 12 V, and the target threshold voltage level being different. Then, the program operation is complete after the "01" programming sequence is done.

Herein, in each information programming, the programming pulse voltage applied to the word line was assumed to be constant throughout the sequence. However, the programming sequence can be complete in a shorter time by using a pulse train in which a higher voltage is applied with increasing number.

Figure 13:
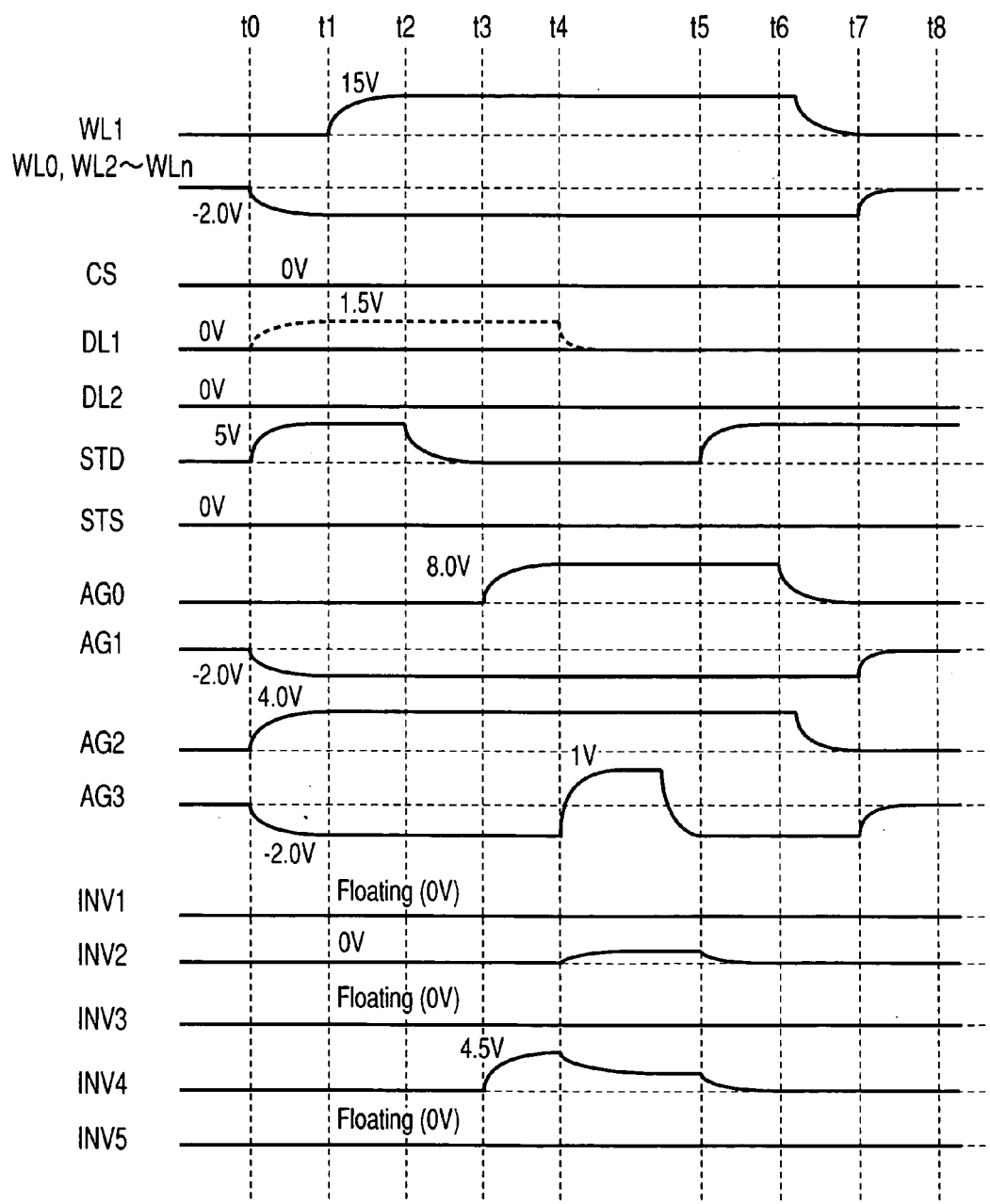
FIG. 13 is a timing chart of a program operation of a memory cell array of a semiconductor memory device of the second embodiment. The operation of the assist electrode line is different from FIG. 5

Moreover, in FIG. 12, the assist electrode line (AG3) is controlled to be 0 V as the base level and 1 V while programming. As shown in FIG. 13, the sequence may be taken in which it is controlled once to be a negative voltage, about −2 V, at the timing (t0) and then activated to be 1 V while programming. In this case, the assist electrode line (AG3) can be reliably made a cut-off during the period until programming is started at the timing (t4) after controlling the inversion layer wiring (INV4) to be 4.5 V. Specifically, the leakage current, which flows through the assist electrode line (AG3) before programming is started, can be controlled, so that there is an effect that a reduction in the programming speed can be suppressed.

Next, the read operation will be described by using FIG. 14. Information of the memory cell (M13) which was programmed in the aforementioned description of a program operation will be read.

First, at the timing (t0), a voltage Vread which is needed for reading or for verify timing is applied to the selected word line (WL1). At the same time, 0 V or a negative voltage, for instance −2 V, is applied to the unselected word lines (WL0, WL2 to WLn). Since the unselected word lines have already been controlled to be 0 or a negative voltage, for instance −2 V, it is not necessary to control the voltage of the unselected word lines again while verifying after applying a programming bias voltage. As a result, it is possible to control an unnecessary leakage current in the memory cell on the unselected word lines, resulting in highly accurate reading being achieved. Moreover, a negative voltage, for instance −2 V, is applied simultaneously to the assist electrode lines (AG1 and AG2). As a result, it becomes possible to suppress a leakage current flowing thorough the memory cell (Ml4) which is adjacent to the selected memory cell (M13) on the same word line, resulting in highly accurate reading being achieved.

Then, at the timing (t2), the assist electrode lines (AG0 and AG3) are controlled to be a positive voltage of about 4 V to form the inversion layer wirings (INV4 and INV3) at the surface of the silicon substrate (SUB) underneath the assist electrode lines (AG0 and AG3), respectively.

Then, at the timing (t3), the data line (DL2) is pre-charged to be a positive voltage of about 1.2 V to make the data line (DL2) a floating state. At this time, the inversion layer wiring (INV4) is also pre-charged to be 1.2 V together with the data line (DL2).

At the timing (t4), the gate signal (STS) of the selected transistor is activated to be a positive voltage of about 5 V. Then, the inversion layer wiring (INV3) is connected to the common source line (CS) and the inversion layer wiring (INV3) becomes 0 V. In the case when the threshold voltage of the memory cell (M13) is lower than the voltage Vread applied to the selected word line, the memory cell (M13) becomes ON state, and a current flows from the data line (DL2) to the common source line (CS) through the inversion layer wiring (INV4), the memory cell (M13), and the inversion layer wiring (INV3). Since the data line (DL2) is in a floating state, the prior pre-charged voltage of 1.2 V is decreased. On the other hand, in the case when the threshold voltage of the memory cell (M13) is higher than the voltage Vread applied to the selected word line, the memory cell (M13) becomes an OFF state, and the voltage applied to the data line (DL2) is kept in the pre-charged state of 1.2 V.

After a predetermined time, the gate signal (STD) of the selected transistor is deactivated to be 0 V at the timing (t5), the inversion layer wiring (INV4) is disconnected from the data line (DL2), and the state of the data line (DL2) is discriminated by using a sense amplifier at the subsequent timing (t6).

In order to discriminate the four threshold voltage levels, it is discriminated whether the level is higher than the threshold voltage level of "00", that is, higher than V2L, or less than the level of "10", that is, lower than V1H. For this, a voltage Vrw1, which is V1H<Vrw1<V2L, is applied to the selected word line (WL1). If the threshold voltage level of the memory cell (M13) is lower than V1H, the memory cell (M13) becomes a conductive state, and the data line (DL2) is discharged to be 0 V. Moreover, if the threshold voltage level of the memory cell (M13) is higher than V2L, the memory cell (M13) becomes a nonconductive state or a high resistance state, and the data line (DL2) keeps the pre-charged state of 1.2 V. The discrimination whether the upper bit is "0" or "1" is performed by using the difference of the states of the data line (DL2). If this result is lower than V1H, a voltage Vrw0, where V0H<Vrw0<V1L, is applied to the selected word line (WL1) in the subsequent read operation to discriminate whether it is "11" or "10" by using the difference of the flowing currents. In the case when the reading result is higher than V2L, the voltage applied to the selected word line (WL1) is controlled to be Vrw2, where V2H<Vrw2<V3. The discrimination whether it is "00" or "01" is performed by using the difference of flowing currents.

In the aforementioned read operation, without changing the following applied voltage conditions according to the results using Vrw1, it is also possible for reading information to use a means where all read operations are carried out by Vrw0, Vrw1, and Vrw2. While the former is suitable for increasing speed because the read voltage is applied twice, the latter has the feature that the control circuit can be simplified in spite of the fact that read operations need to be done three times.

Figure 14:
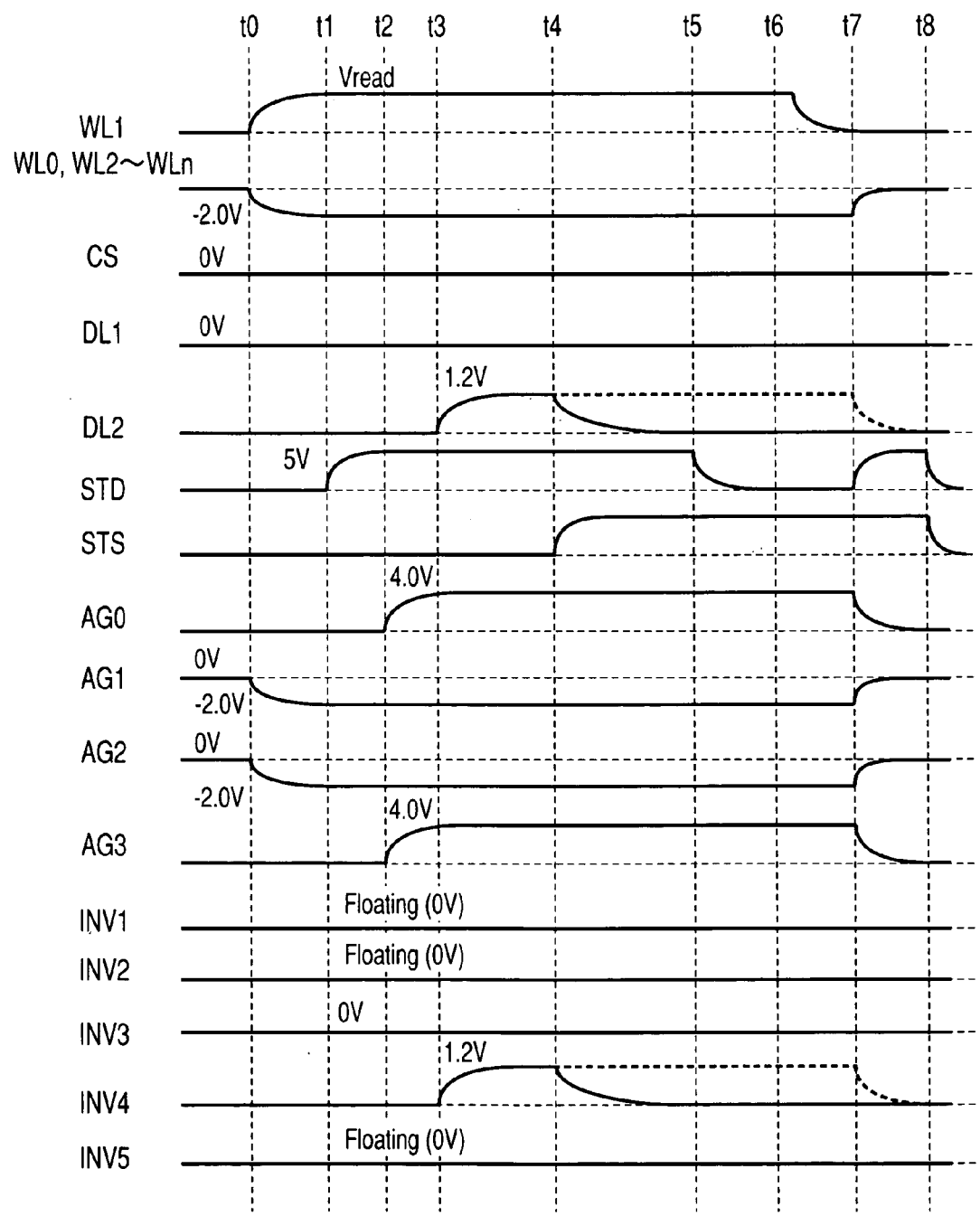
FIG. 14 is a timing chart of a read operation of a memory cell array of a semiconductor memory device of the second embodiment.
Figure 15:
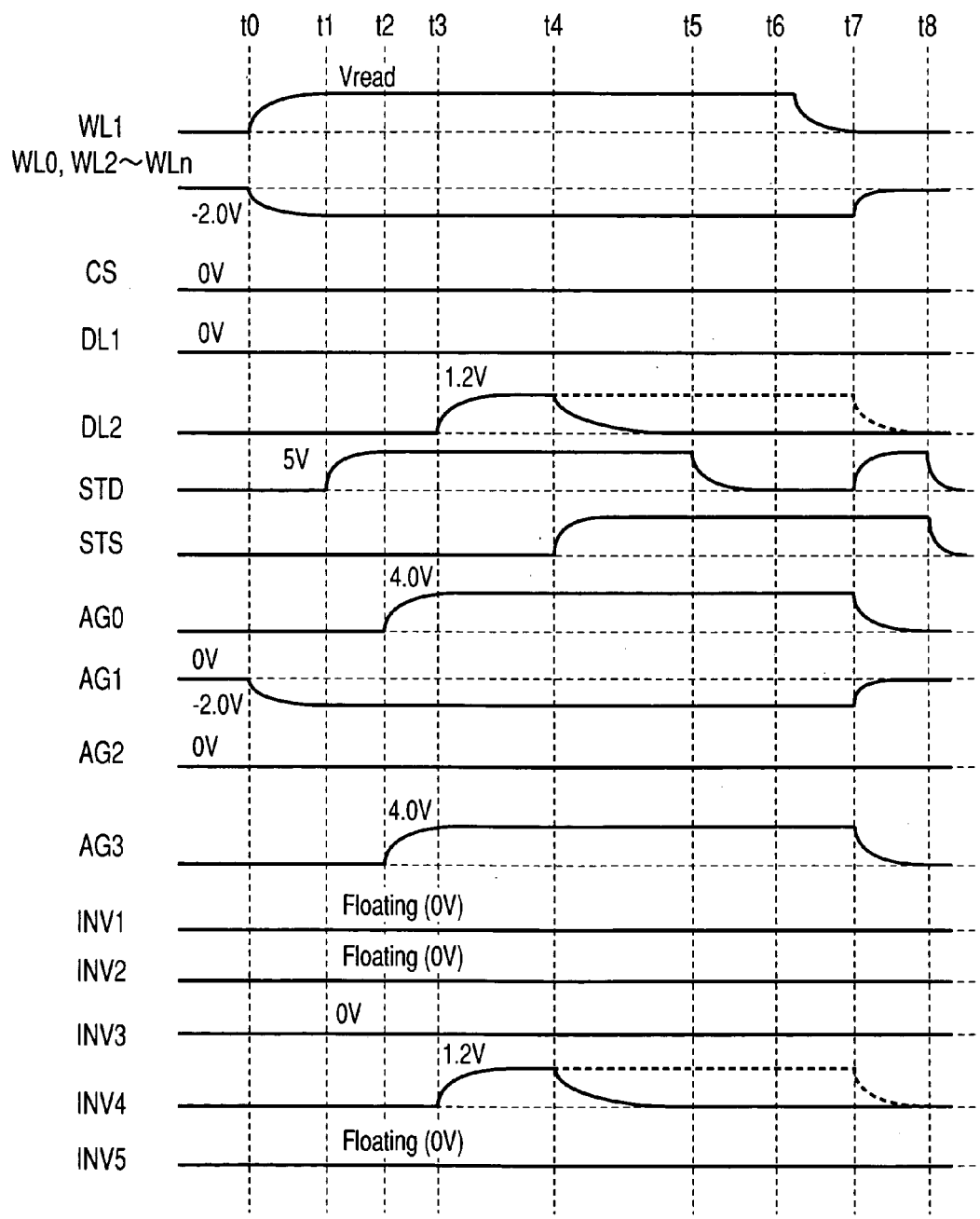
FIG. 15 is a timing chart of a read operation of a memory cell array of a semiconductor memory device of the second embodiment. The operation of the assist electrode line is different from FIG. 5.

FIG. 14 explained the case when both assist electrode lines (AG1 and AG2) which were not the reading paths were controlled to be a negative voltage at timing (t0), for instance −2 V. Reading may be performed by controlling only the assist electrode line (AG1) to be a negative voltage, for instance −2 V, and maintaining the assist electrode line (AG2) at 0 V, as shown in FIG. 15. Accordingly, in the case when the verify reading is performed right after the program operation described in FIG. 12, only the assist electrode line (AG1) can be controlled to be a negative voltage, for instance −2 V, following the program operation, so that there is the effect that the overhead time can be reduced during the verify reading.

In this embodiment, it is possible to apply a desired positive or negative voltage to the assist electrode line and the word line by having the configuration of a block decoder shown in FIG. 9, for instance.

The above was explained on the precondition that the storage node consists of a continuous film of polycrystalline silicon, but the storage node may be composed of a plurality of fine particles. Moreover, the storage node may be composed of a plurality of fine particles of other semiconductor and metallic materials. Moreover, fine particles of an insulating material having a charge trap may also be used. If the fine particles are used, the storage nodes are insulated from each other, so that it is not necessary to separate each other by patterning like a storage node composed of a continuous film of polycrystalline silicon. As a result, it has the feature that patterning becomes easier and the process margin increases. Moreover, since such process simplicity can be obtained even if an insulator film such as SiN which has a trap is employed, this may also be used. Etching of SiN is possible, in which SiN has a selection ratio against a $SiO_2$ film, and it has superior characteristics with respect to patterning compared with a fine particle charge trapping region. On the other hand, the fine particle charge trapping region can be surrounded by the other insulating material such as $SiO_2$ which does not have a trap, so that it is generally possible to select a material in which charge transfer hardly occurs and it has excellent retention properties. As a result, it is suitable for multilevel storage having a small threshold margin. Therefore, it is preferable for applications in which a plurality of information is stored by injected charge and where it is desirable to suppress the fluctuation in properties. Moreover, a nitrogen-doped $SiO_2$ film may be used for the interpoly film between the storage node and the word line in lieu of a $SiO_2$ film. It has the feature that the trap is not created easily compared with a simple $SiO_2$ film in the case of programming/erasing and the fluctuations in properties are small. Moreover, a stacked structure of $SiO_2$ and silicon nitride film may be taken. Such a stacked structure also has the feature that a current does not flow relatively easily while applying a high electric field and the memory element has excellent reliability. The above descriptions about the configuration of the charge trapping region and the configuration of the interpoly film are all similar in other embodiments.

Third Embodiment

The third embodiment of the present invention will be described by using FIGS. 16 to 18.

Figure 1:
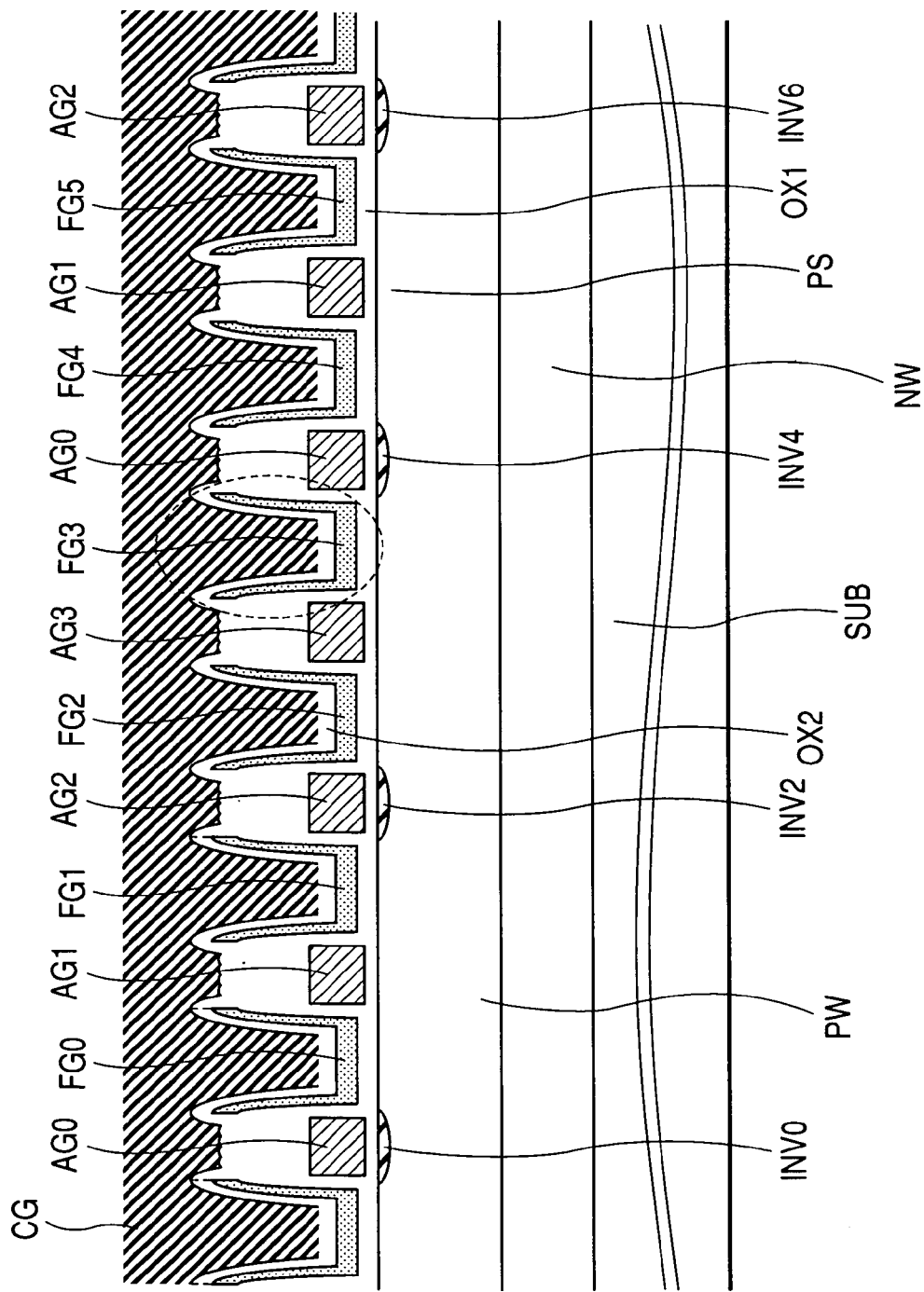
FIG. 1 shows a cross-sectional structural drawing of a memory cell array part of a semiconductor memory device of the first embodiment together with a local bit line arrangement, in the case of a program operation.
Figure 2:
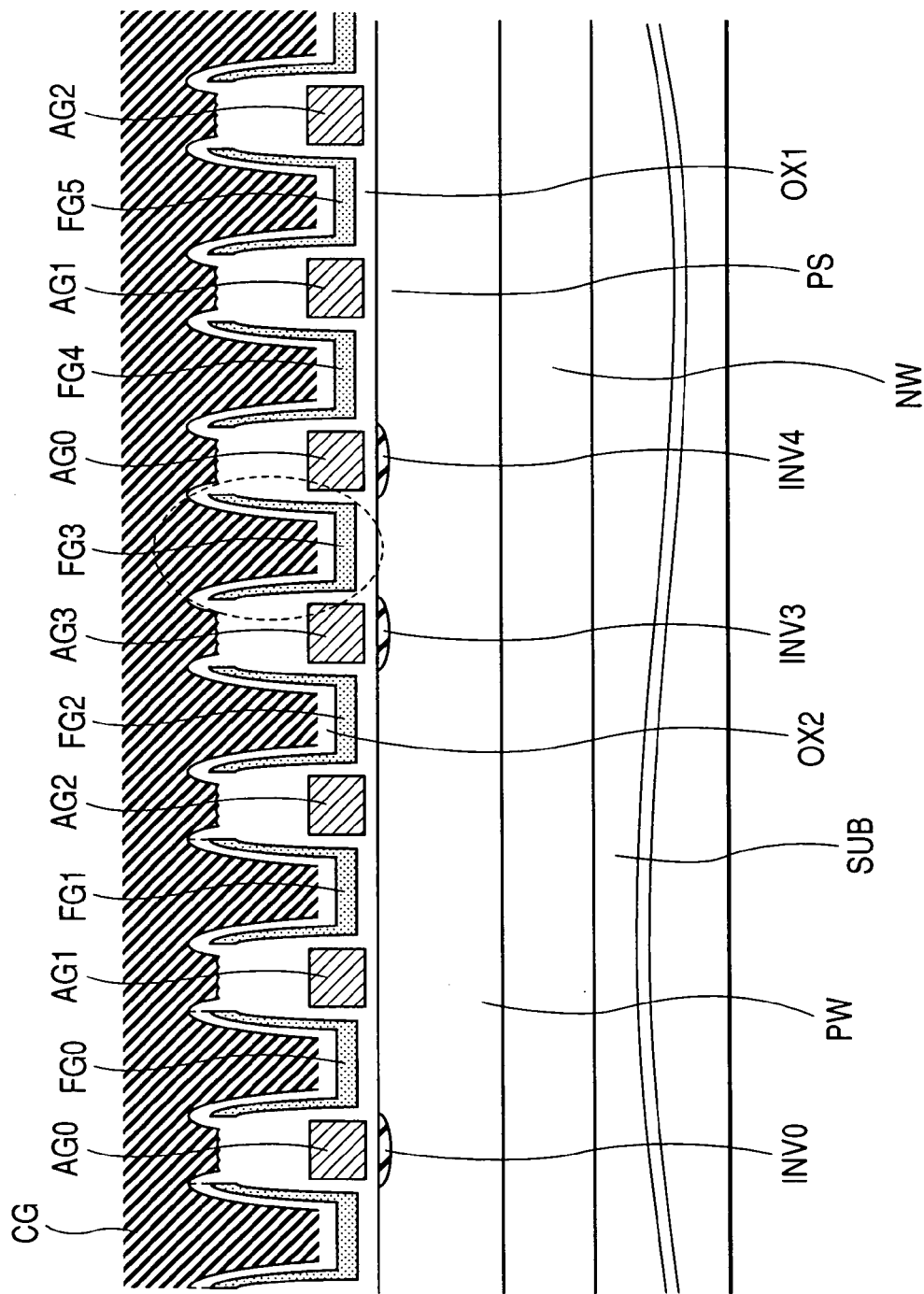
FIG. 2 shows a cross-sectional drawing of a memory cell array part of a semiconductor memory device of the first embodiment together with a local bit line arrangement in the case of a read operation.
Figure 16:
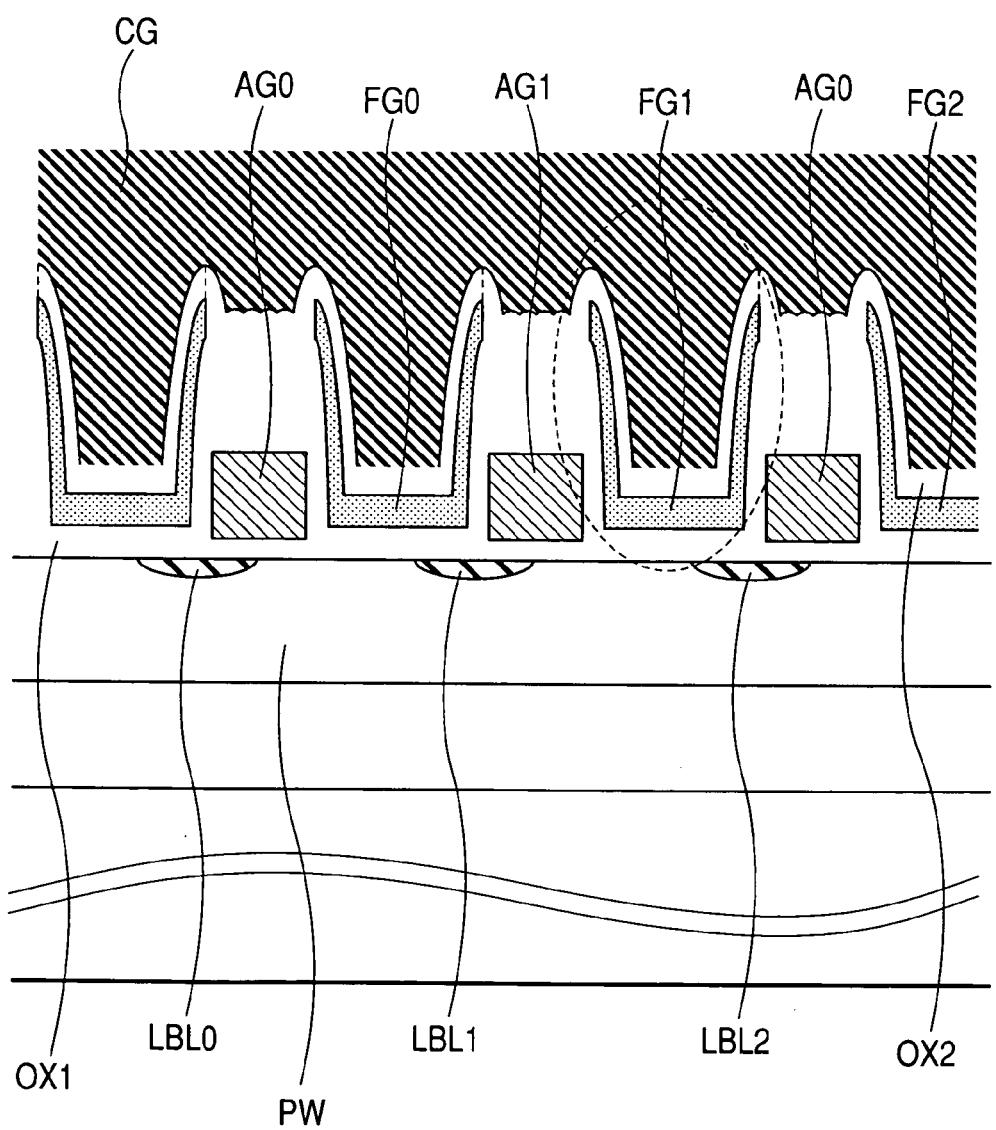
FIG. 16 is a cross-sectional drawing illustrating a memory cell array part of a semiconductor memory device of the third embodiment.

Compared with FIG. 1 of the first embodiment, the cross-sectional drawing of a memory cell shown in FIG. 16 has a feature that the diffusion layer wirings (LBL0, LBL1, and LBL2) are formed at the surface of the silicon substrate between the storage node and the assist electrode line.

Figure 17:
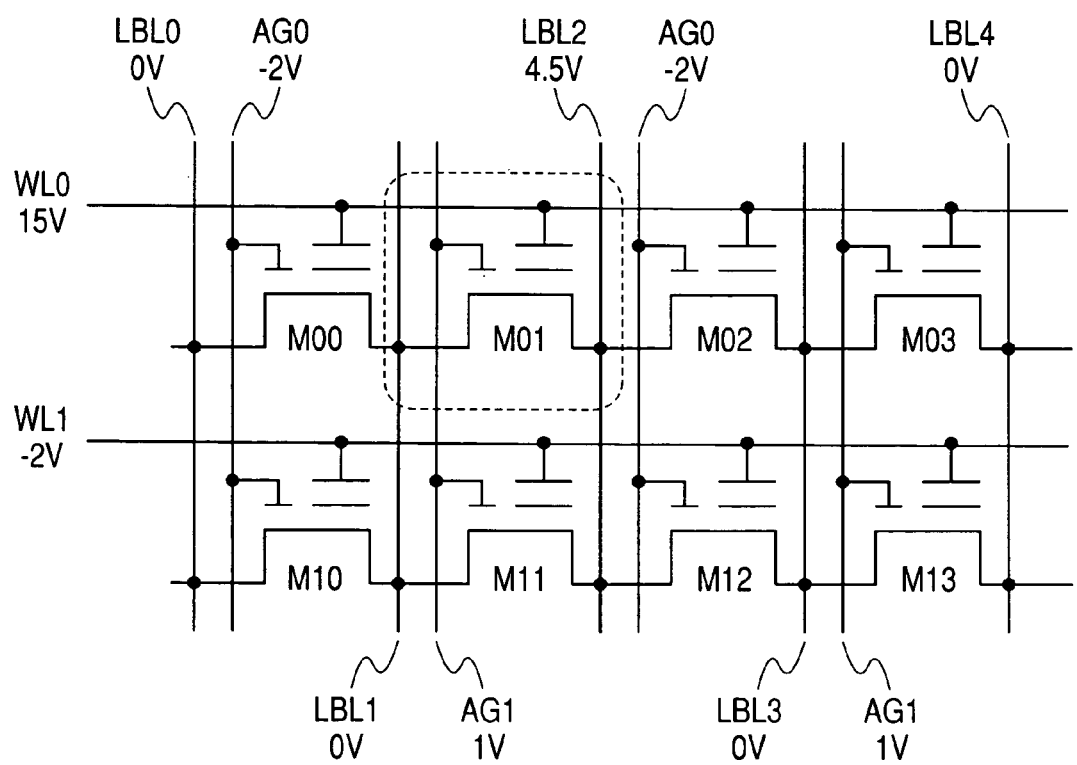
FIG. 17 shows an equivalent circuit drawing of a memory cell array of a semiconductor memory device of the third embodiment together with a voltage condition in the case of programming.
Figure 18:
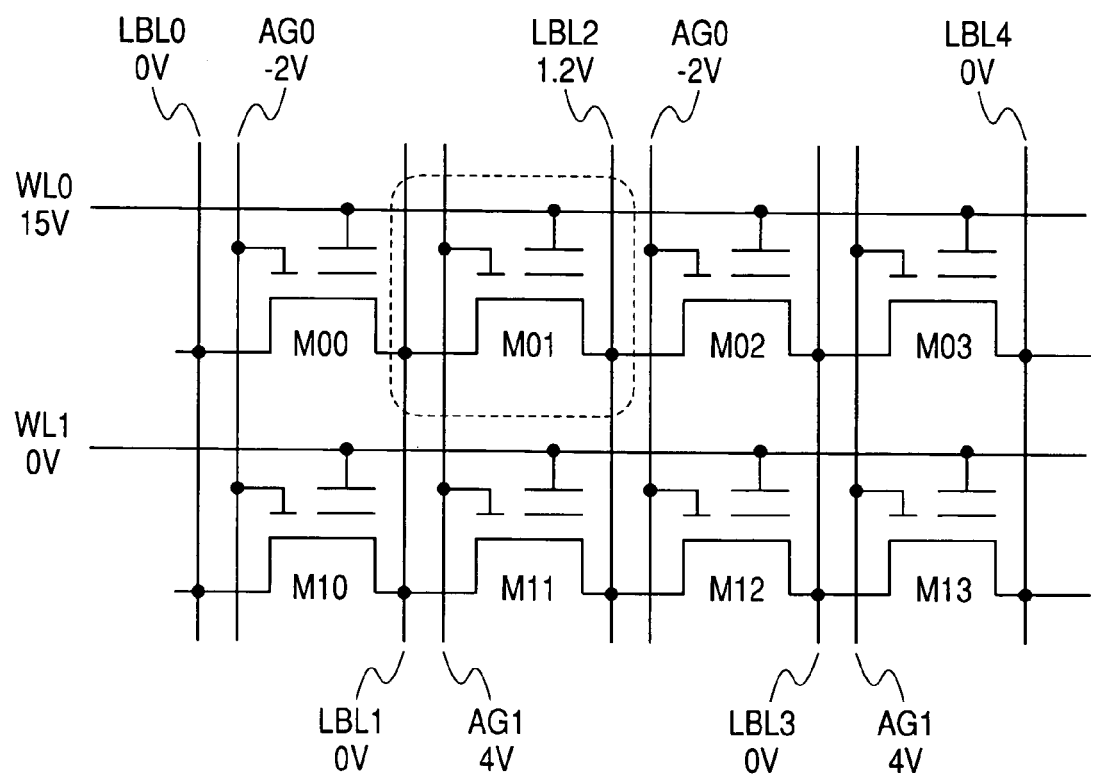
FIG. 18 shows an equivalent circuit drawing of a memory cell array of a semiconductor memory device of the third embodiment together with a voltage condition in the case of reading.

FIG. 17 is an equivalent circuit of the memory cell. FIG. 17 also shows an example of the bias condition in the case when programming is performed to the memory cell (M01). In the case when programming is performed to the memory cell (M01), a positive high voltage of about 15 V is applied to the corresponding word line (WL0); 0 V is applied to the diffusion layer wiring (LBL1); and 4.5 V is applied to the diffusion layer wiring (LBL2). Moreover, a current can be made to flow through the memory cell (M01) in the space between the diffusion layer wiring (LBL1) and (LBL2) by controlling the assist electrode line (AG1) to be 1 V. At this time, electric field concentration occurs at the boundary of the weak inversion region underneath the assist electrode line (AG1) and the inversion layer underneath the memory cell (M01), resulting in hot electrons being created. The hot electrons created are induced by the electric field generated by a high voltage of the selected word line (WL0) in a direction perpendicular to the substrate and are injected in the storage node of the adjacent memory cell (M01). Here, since the resistance of the weak inversion region underneath the assist electrode line (AG1) is high, the current flowing between the diffusion layer wiring (LBL1) and the diffusion layer wiring (LBL2) is not so large, so that the ratio of the injected electrons to the storage node can be made greater considering the flowing current. Accordingly, the current does not become too great even during the simultaneous program operation of a plurality of cells; therefore, it is favorable for a file application in which input/output of a large bit count is performed at the same time.

In the case when programming is performed to the memory cell, flowing a leakage current from the diffusion layer wiring (LBL2) to the diffusion layer wiring (LBL3) through the memory cell (M02) can be suppressed by controlling the assist electrode line (AG0) to be a negative voltage, for instance −2 V. Accordingly, there is a result that not only can useless current consumption be suppressed during programming, but also the deterioration of programming characteristics of the target memory cell can be controlled.

The read operation of memory cell (M01) will be described by using FIG. 18. In the case when reading is performed to the memory cell (M01), a predetermined voltage is applied to the corresponding word line (WL0). Herein, the predetermined voltage may be, for instance, the voltage condition shown in Table 1. At the same time, positive voltages of 0 V, 1.2 V, and about 4 V are applied to the diffusion layer wiring (LBL1), the diffusion layer wiring (LBL2), and the assist electrode line (AG1), respectively. Herein, in the case when the threshold voltage of the memory cell (M01) is higher than the voltage applied to the word line (WL0), the memory cell (M01) is in an OFF state. As a result, current does not flow between the diffusion layer wiring (LBL1) and the diffusion layer wiring (LBL2). On the other hand, in the case when the threshold voltage of the memory cell (M01) is lower than the voltage applied to the selected word line (WL0), the memory cell (M01) is in an ON state, so that current flows between the diffusion layer wiring (LBL1) and the diffusion layer wiring (LBL2). Specifically, the threshold voltage of the memory cell (M01) can be discriminated by the current flowing between the diffusion layer wiring (LBL1) and the diffusion layer wiring (LBL2).

As mentioned above, flowing a leakage current from the diffusion layer wiring (LBL2) to the diffusion layer wiring (LBL3) through the memory cell (M02) can be suppressed by controlling the assist electrode line (AG0) to be a negative voltage, for instance −2 V. As a result, controlling the flow of the current in parts other than the target memory cell for reading becomes possible, with the result that highly accurate read operations can be achieved.

This embodiment described the bias conditions for programming and reading. However, in the case when the memory cell of this embodiment is a multilevel memory which can keep two bits of information per cell, programming and reading can be performed in the sequence described in the first embodiment.

The above was explained on the precondition that the storage node consists of a continuous film of polycrystalline silicon, but the storage node may be composed of a plurality of fine particles. Moreover, the storage node may be composed of a plurality of fine particles of other semiconductor and metallic materials. Moreover, fine particles consisting of an insulating material having a charge trap may also be used. If the fine particles are used, the storage nodes are insulated from each other, so that it is not necessary to separate each other by patterning like a storage node composed of a continuous film of polycrystalline silicon. As a result, it has the feature that patterning becomes easier and the process margin increases. Moreover, since such process simplicity can be obtained even if an insulator film such as SiN which has a trap is employed, this may also be used. Etching of SiN is possible, in which SiN has a selection ratio against a $SiO_2$ film, and it has superior characteristics with respect to patterning compared with a fine particle charge trapping region. On the other hand, the fine particle charge trapping region can be surrounded by the other insulating material such as $SiO_2$ which does not have a trap, so that it is generally possible to select a material in which charge transfer hardly occurs and it has excellent retention properties. As a result, it is suitable for multilevel storage having a small threshold margin. Therefore, it is preferable for applications in which a plurality of information is stored by injected charge and where it is desirable to suppress the fluctuation in properties. Moreover, a nitrogen-doped $SiO_2$ film may be used for the interpoly film between the storage node and the word line in lieu of a $SiO_2$ film. It has the feature that the trap is not created easily compared with a simple $SiO_2$ film in the case of programming/erasing and the fluctuation in properties is small. Moreover, a stacked structure of $SiO_2$ and silicon nitride film may be taken. Such a stacked structure also has the feature that a current does not flow relatively easily while applying a high electric field and the memory element has excellent reliability. The above descriptions about the configuration of the charge trapping region and the configuration of the interpoly film are all similar in other embodiments.

Fourth Embodiment

Figure 19:
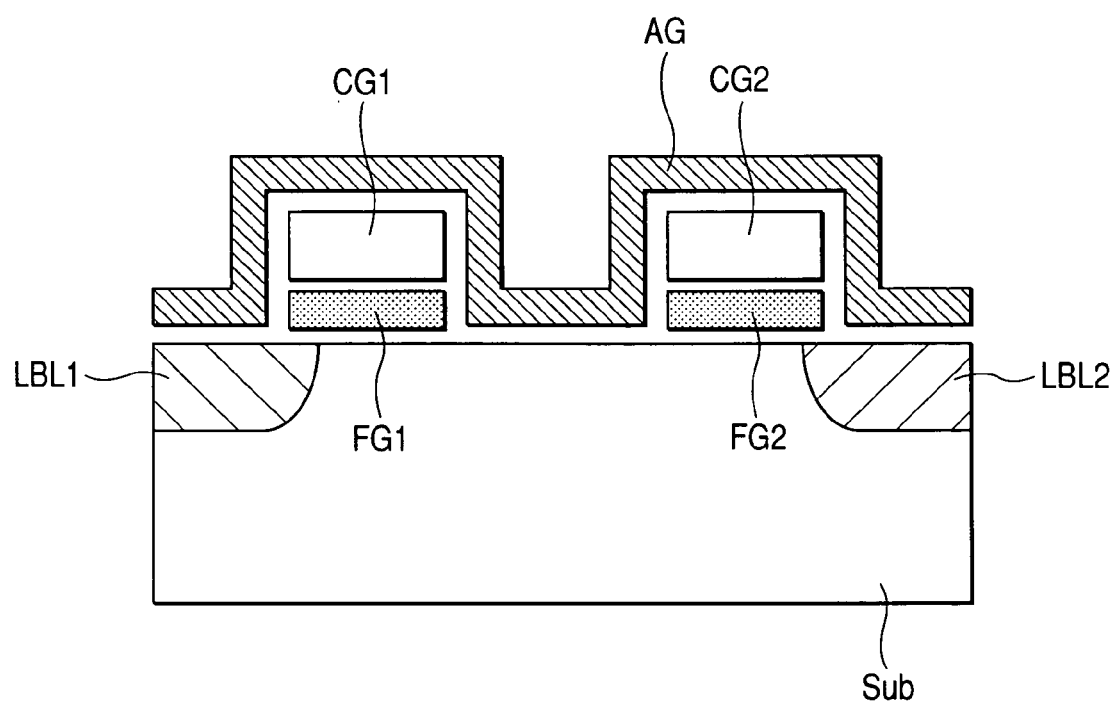
FIG. 19 is a cross-sectional drawing illustrating a memory cell array part of a semiconductor memory device of the fourth embodiment.
Figure 20:
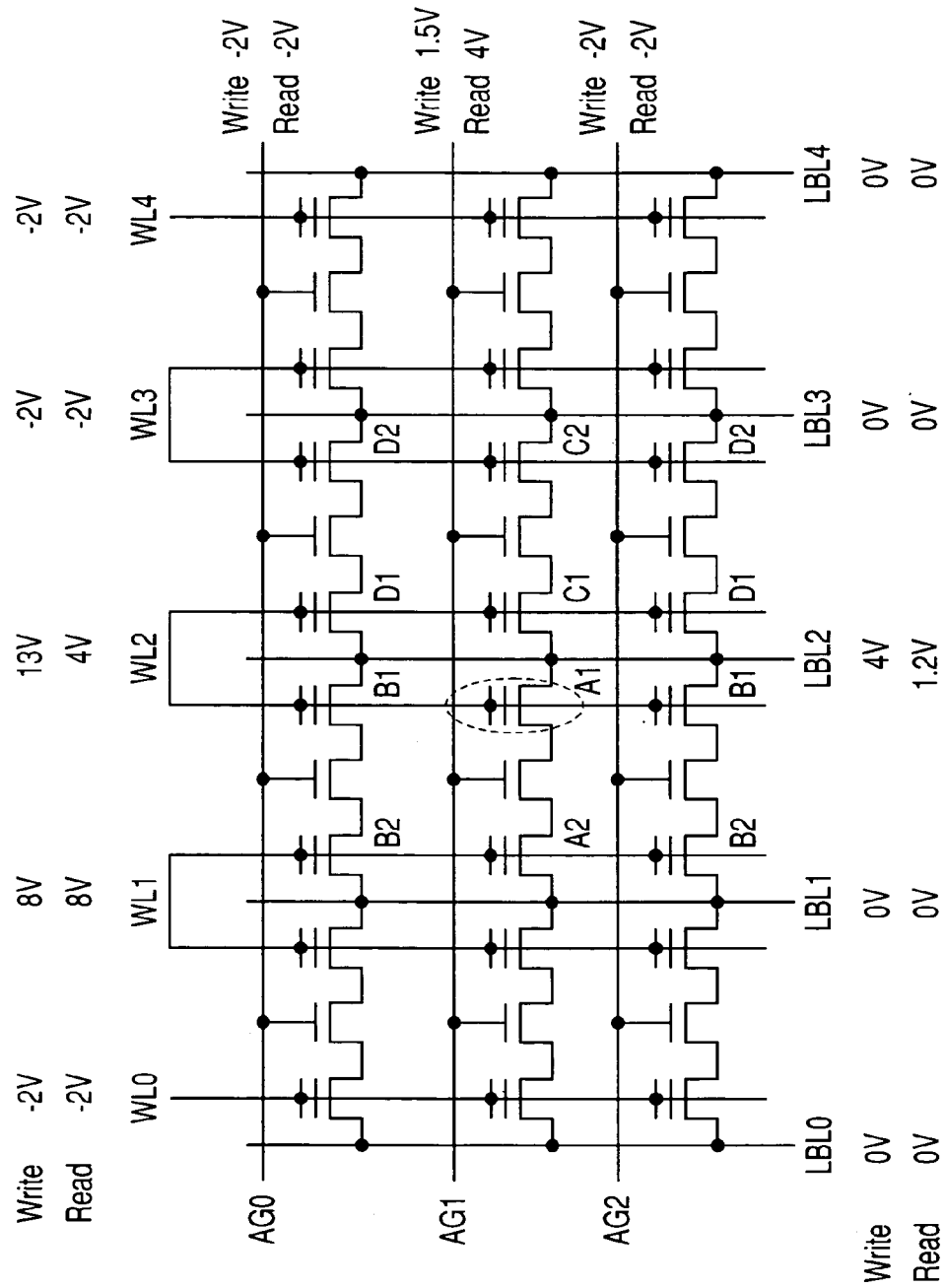
FIG. 20 shows an equivalent circuit drawing of a memory cell array of a semiconductor memory device of the fourth embodiment together with a voltage condition in the case of programming.

The fourth embodiment of the present invention will be described by using FIGS. 19 to 20. The 2-bit/cell type integration nonvolatile semiconductor memory device shown in FIG. 19 has a configuration in which two memory cells having the storage nodes (FG1) and (FG2) composed of polycrystalline silicon and the control gate electrodes (CG1 and CG2) are formed on the silicon substrate (SUB); the diffusion layer wirings (LBL1 and LBL2) connected to the source line/bit line are formed outside thereof, as well as a switch transistor having the assist electrode line (AG) is formed between the aforementioned two memory cell transistors.

The aforementioned memory transistors share the one aforementioned switch transistor. This switch transistor is formed self-aligned between the two memory cell transistors, and is not considered to bring an increase in the area. This 2-bit/cell realizes the integration of a self-aligned 1.5 transistor configuration per bit. In the case when programming and reading are performed in the 2 bit-memory in the one cell shown in FIG. 19, the directions of the current flowing in the channels are reverse-directed to each other in the 2 bits/cell type memory cell. FIG. 20 is an equivalent circuit of an array configuration using the memory cell shown in FIG. 19. Bias conditions for programming and reading are also described in the figure.

First, a program operation will be described. Herein, the case of programming to the memory cell (A1) shown in FIG. 20 will be described. In the case when programming is performed in the memory cell (A1), a positive high voltage, for instance, 13 V, is applied to the selected word line (WL2), and a positive voltage, for instance, 8 V, is applied to the word line (WL1) of the same cell. 0 V or a lower negative voltage, for instance −2 V, is applied to word lines (WL0, WL3, and WL4) other than those above. Moreover, 0 V is applied to the local bit line (LBL1) which becomes a source of the memory cell (A1), and a voltage of about 4V is applied to the local bit line (LBL2) which becomes a drain. Furthermore, applying a voltage of about 1.5 V to the selected assist electrode line (AG1) brings the local bit line (LBL1) and the local bit line (LBL2) into conduction, resulting in current flowing in the memory cell (A1). At this time, electric field concentration occurs at the boundary of the weak inversion region underneath the assist electrode line (AG1) and the inversion layer underneath the memory cell (A1), resulting in hot electrons being created. The hot electrons created are induced by the electric field generated by the voltage of the selected word line (WL2) in a direction perpendicular to the substrate and are injected into the storage node of the adjacent memory cell (A1). Since the resistance of the weak inversion region underneath the assist electrode line (AG1) is high, the current flowing between the local bit line (LBL1) and the local bit line (LBL2) is not so large, so that the ratio of the injection electrons to the storage node can be made greater considering the flowing current. Accordingly, the current does not become too great even during the simultaneous program operation of a plurality of cells, therefore, it is favorable for a file application in which input/output of a large bit count is performed at the same time.

In the present invention, the aforementioned program operation is characterized by controlling the assist electrode lines (AG0 and AG2) except for the selected assist electrode line (AG1) to be a negative voltage, for instance about −2 V. Thus, by controlling the unselected assist electrode lines (AG0 and AG2) to be negative voltages, one suppresses a leakage current flowing between the local bit line (LBL1) and the local bit line (LBL2) through the memory cell (B1) arranged in parallel with the selected memory cell (A1) and the memory cell (B2) which shares an assist electrode line with the memory cell (B1). As a result, there are the effects that the current consumption during programming can be suppressed and the deterioration of the programming characteristics of the target memory cell (A1) for programming can also be suppressed.

Moreover, the present invention is characterized by controlling the unselected word lines (WL0, WL3, and WL4) except for the selected word line (WL1 and WL2) to be a negative voltage, for instance −2 V. Thus, by controlling the unselected word lines (WL0, WL3, and WL4) to be negative voltages one suppresses a leakage current flowing from the local bit line (LBL2) to the local bit line (LBL3) through the memory cells (C1 and C2) which share an assist electrode line (AG1) with the selected memory cell (A1). As a result, there are the effects that the current consumption during programming can be suppressed and the deterioration of the programming characteristics of the target memory cell (A1) for programming can also be suppressed.

Next, the reading operation will be described. Herein, the case of reading the memory cell (A1) shown in FIG. 20 will be described. In the case when reading is performed in the memory cell (A1), a predetermined reading voltage, for instance 4 V, is applied to the selected word line (WL2), and a positive voltage, for instance 8 V, is applied to the word line (WL1) in the same cell. The reason for applying a relatively high voltage, for instance 8 V, to the word line (WL1) is due to reading the target memory cell (A1) irrespective of the threshold voltage condition of the memory cell (A2). 0 V or a low negative voltage, for instance −2 V, is applied to the other word lines from these, (WL0, WL3, and WL4). Moreover, 0 V is applied to the local bit line (LBL1) which becomes a source of the memory cell (A1), and a voltage of about 1.2 V to the local bit line (LBL2) which becomes a drain. Furthermore, a voltage of about 4 V is applied to the selected assist electrode line (AG1). At this time, when the threshold voltage of the memory cell (A1) is higher than the voltage applied to the word line (WL2) (herein, 4 V), the memory cell (A1) becomes an OFF state, and the space between the local bit line (LBL1) and the local bit line (LBL2) is brought into non-conduction. On the other hand, in the case when the threshold voltage of the memory cell (A1) is lower than the voltage applied to the word line (WL2) (herein, 4 V), the memory cell (A1) becomes ON state, and the space between the local bit line (LBL1) and the local bit line (LBL2) is brought into conduction, resulting in electric current flow. Thus, it becomes possible to discriminate the threshold voltage condition of memory cell (A1) by whether current flows between the local bit line (LBL1) and the local bit line (LBL2).

In the present invention, the aforementioned reading operation is characterized by controlling the assist electrode lines (AG0 and AG2) except for the selected assist electrode line (AG1) to be a negative voltage, for instance −2 V. Thus, by controlling the unselected assist electrode lines (AG0 and AG2) to be negative voltages, one suppresses a leakage current flowing between the local bit line (LBL1) and the local bit line (LBL2) through the memory cell (B1) arranged in parallel with the selected memory cell (A1) and the memory cell (B2) which shares an assist electrode line with the memory cell (B1). As a result, there is the effect that the target memory cell can be read with higher accuracy.

Moreover, the present invention is characterized by controlling the unselected word lines (WL0, WL3, and WL4) except for the selected word line (WL1 and WL2) to be a negative voltage, for instance −2 V. Thus, by controlling the unselected word lines (WL0, WL3, and WL4) to be negative voltages, one suppresses a leakage current flowing from the local bit line (LBL2) to the local bit line (LBL3) through the memory cells (C1 and C2) which share the assist electrode line (AG1) with the selected memory cell (A1). As a result, there is the effect that the target memory cell can be read with higher accuracy.

Fifth Embodiment

Figure 21:
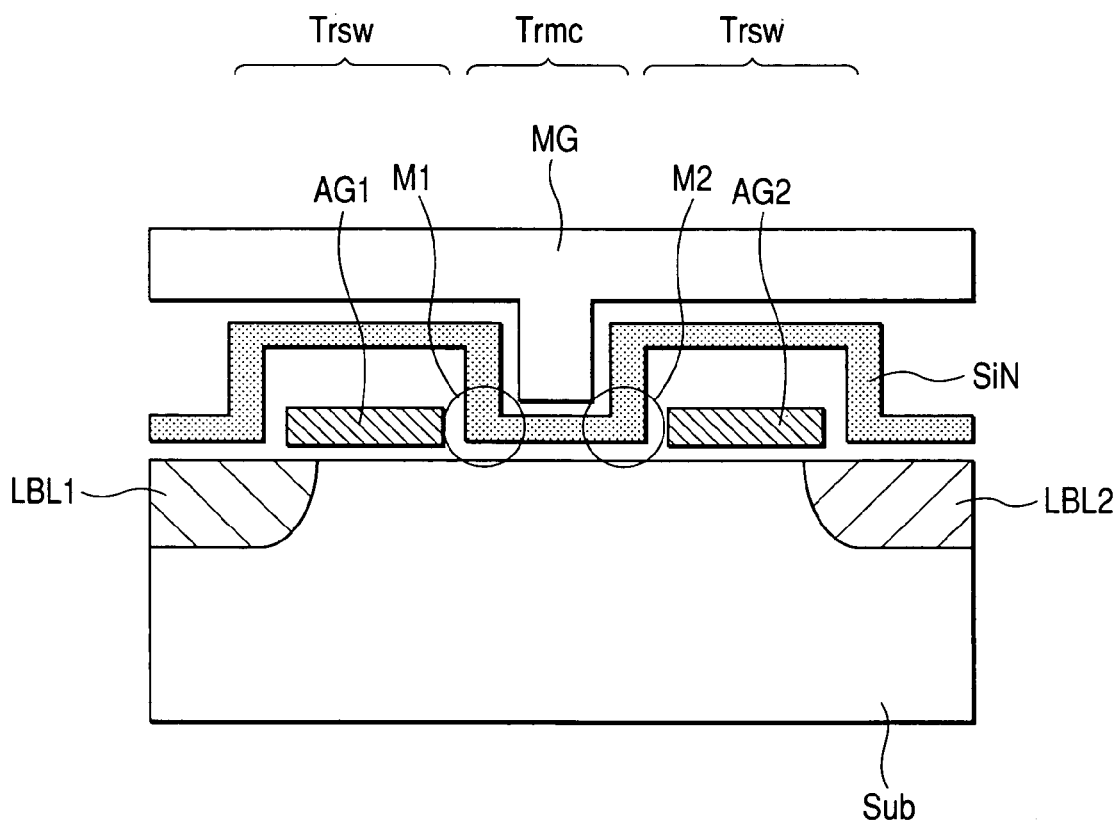
FIG. 21 shows a structure of a memory cell array part of a semiconductor memory device of the fifth embodiment.
Figure 22:
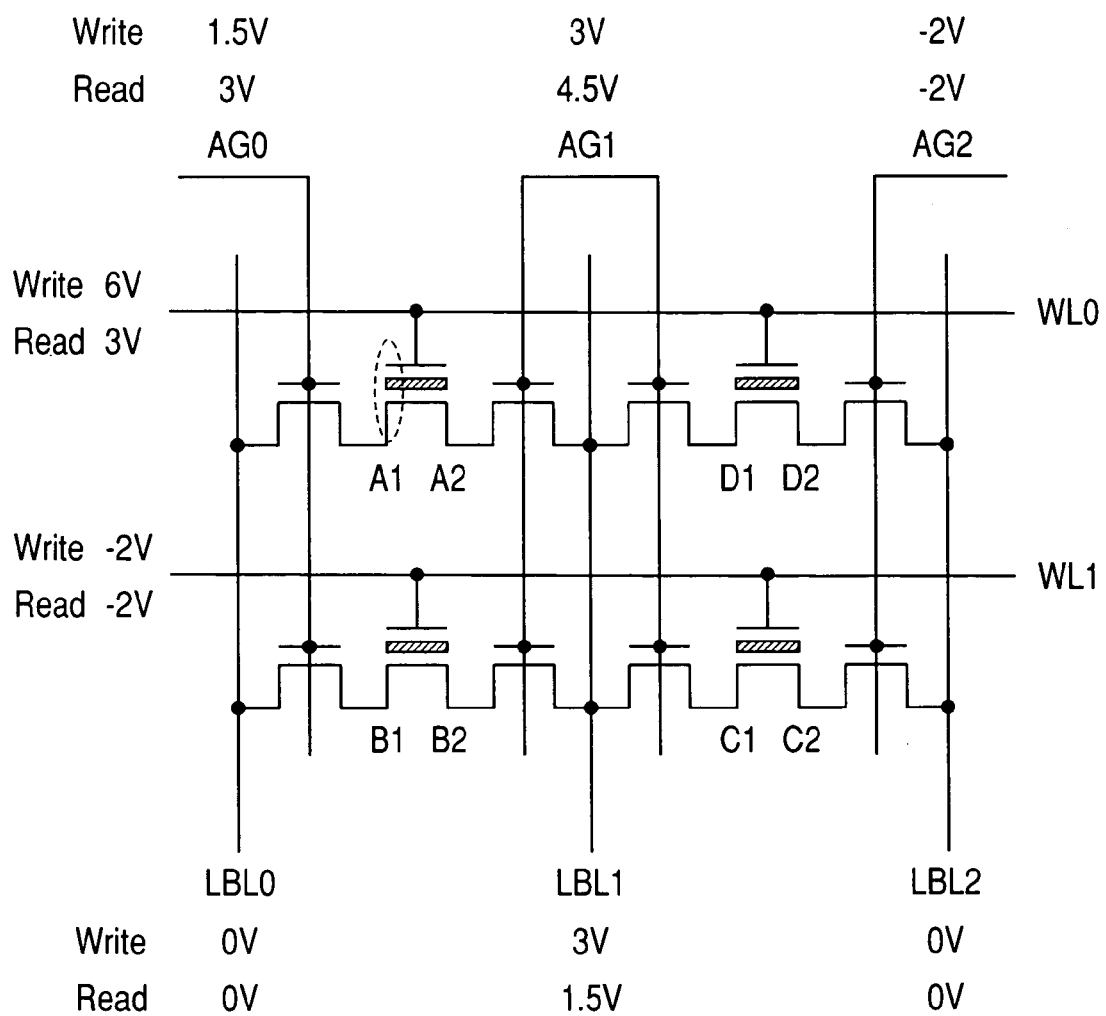
FIG. 22 shows an equivalent circuit drawing of a memory cell array of a semiconductor memory device of the fifth embodiment together with a voltage condition in the case of programming and reading.

The fifth embodiment of the present invention will be described by using FIGS. 21 to 22. The memory cell shown in FIG. 21 consists of a memory cell transistor part (Trmc) which has a gate insulator film (SiN) discretely including traps and a memory gate electrode (MG), and switch transistor parts (Trsw) which have assist electrode lines (AG1 and AG2) provided at both sides thereof. This memory cell is one where local programming is performed to the gate insulator film (SiN) which discretely includes traps as a storage part for storing information charge, and where multilevel storage is achieved in which one memory cell thereof stores at least information of 2 bits. In order to realize the source side injection, the memory cell has the switch transistor parts (Trsw) provided with the assist electrode lines (AG1 and AG2) and is formed self-aligned with the memory transistor part (Trmc). FIG. 22 is an equivalent circuit of an array configuration using the memory cell shown in FIG. 21. The bias condition for programming and reading is also described in the figure.

First, the program operation will be described. Herein, the case of programming to the memory cell (A1) shown in FIG. 22 will be described. In the case when programming is performed in the memory cell (A1), the selected word line (WL0) is controlled to be about 6 V, and the other unselected word line (WL1) is controlled to be a negative voltage, for instance −2 V. Moreover, voltages of 1.5 V and about 3 V are applied to the source side assist electrode line (AG0) of selected memory cell (A1) and the drain side assist electrode line (AG1) thereof, respectively, and a negative voltage, for instance −2 V, is applied to the unselected assist electrode line (AG2) Moreover, 0 V is applied to the local bit line (LBL0) which becomes the source of the memory cell (A1) and about 3 V is applied to the local bit line (LBL1) which becomes the drain. The space between the local bit line (LBL1) and the local bit line (LBL2) is brought into conduction under such voltage conditions, resulting in a current flowing in the memory cell (A1). At this time, field concentration occurs at the border of the weak inversion region underneath the assist electrode line (AG0) and the inversion layer underneath the memory cell (A1), resulting in hot electrons being created. The hot electrons created are induced by the electric field generated by the voltage of the selected word line (WL0) in a direction perpendicular to the substrate and are injected into the storage node of the adjacent memory cell (A1). Since the electrical resistance of the weak inversion region underneath the assist electrode line (AG0) is high, the current that flows between the local bit line (LBL0) and the local bit line (LBL1) is not so large, so that the ratio of the injected electrons to the storage node can be made greater considering the flowing current. Accordingly, the current does not become too great, even during the simultaneous program operation of a plurality of cells; therefore, it is favorable for a file application in which input/output of a large bit count is performed at the same time.

In the present invention, the aforementioned program operation is characterized by controlling the assist electrode lines (AG2) except for the selected assist electrode lines (AG0 and AG1) to be a negative voltage, for instance about −2 V. Thus, by controlling the unselected assist electrode line (AG2) to be a negative voltage, one suppresses a leakage current flowing between the local bit line (LBL1) and the local bit line (LBL2) through the memory cell (D1) and the memory cell (D2) which are both connected to the common word line (WL0) with the selected memory cell (A1). As a result, there are the effects that the current consumption during programming can be suppressed and the deterioration of the programming characteristics of the target memory cell (A1) for programming can also be suppressed.

Moreover, the present invention is characterized by controlling the unselected word line (WL1) except for the selected word line (WL0) to be a negative voltage, for instance −2 V. Thus, by controlling the unselected word line (WL1) one suppresses a leakage current flowing from the local bit line (LBL1) to the local bit line (LBL0) through the memory cell (B1) and the memory cell (B2) arranged in parallel with the selected memory cell (A1). As a result, there are effects that the current consumption during programming can be suppressed and the deterioration of the programming characteristics of the target memory cell (A1) for programming can also be suppressed.

Next, the read operation will be described. Herein, the case of reading the memory cell (A1) shown in FIG. 22 will be described. In the case when reading is performed in the memory cell (A1), a predetermined reading voltage, for instance 3 V, is applied to the selected word line (WL0), and a negative voltage, for instance about −2 V, is applied to the unselected word line (WL1). Moreover, 3 V and 4.5 V are applied to the source side assist electrode line (AG0) of the memory cell (A1) and the drain side assist electrode line (AG1) thereof, respectively. Furthermore, a negative voltage, for instance −2 V, is applied to the unselected assist electrode line (AG2). At the same time, 0 V is applied to the local bit line (LBL0) which becomes the source of the memory cell (A1), and a voltage of about 1.5 V is applied to the local bit line (LBL1) which becomes the drain. In this case, when the threshold voltage of the memory cell (A1) is higher than the voltage applied to the selected word line (WL0) (herein, 3 V), the memory cell (A1) becomes an OFF state, and the space between the local bit line (LBL0) and the local bit line (LBL1) is brought into non-conduction. On the other hand, in the case when the threshold voltage of the memory cell (A1) is lower than the voltage applied to the word line (WL0) (herein, 3 V), the memory cell (A1) becomes an ON state and the space between the local bit line (LBL0) and the local bit line (LBL1) is brought into conduction, resulting in electric current flow. Thus, it becomes possible to discriminate the threshold voltage condition of the memory cell (A1) by whether current flows between the local bit line (LBL0) and the local bit line (LBL1).

In the present invention, the aforementioned read operation is characterized by controlling the assist electrode lines (AG2) except for the selected assist electrode lines (AG0 and AG1) to be a negative voltage, for instance about −2V. Thus, by controlling the unselected assist electrode line (AG2) to be a negative voltage, one suppresses a leakage current flowing between the local bit line (LBL1) and the local bit line (LBL2) through the memory cell (D1) and the memory cell (D2) which are both connected to the common word line (WL0) with the selected memory cell (A1). As a result, there is the effect that the target memory cell can be read with higher accuracy.

Moreover, the present invention is characterized by controlling the unselected word line (WL1) except for the selected word line (WL0) to be a negative voltage, for instance −2 V. Thus, by controlling the unselected word line (WL1) one suppresses a leakage current flowing from the local bit line (LBL1) to the local bit line (LBL0) through the memory cell (B1) and the memory cell (B2) arranged in parallel with the selected memory cell (A1). As a result, there is the effect that the target memory cell can be read with higher accuracy.

The present invention can be applied to a semiconductor memory device.

What is claimed is:

1. A semiconductor memory device comprising:
   a semiconductor substrate,
   a first and a second diffusion layer formed in said semiconductor substrate,
   an insulator film formed at the surface of said semiconductor substrate between said first and second diffusion layers,
   a first electrode formed to overlap a part of said first diffusion layer over said insulator film,
   a second electrode which can be controlled independently from said first electrode,
   a charge trapping region, which stores charge, formed surrounded by an insulator, in the vicinity of the surface of said semiconductor substrate between said first electrode and said second diffusion layer,
   wherein the voltage of said charge trapping region is controlled by said second electrode,
   information are stored in said charge trapping region by using a change of conductance between said first diffusion layer and said second diffusion layer corresponding to the charge stored in said charge trapping region, and
   said first electrode is controlled to be a negative voltage in the case when said charge trapping region is not the target for programming.

2. A semiconductor memory device according to claim 1, wherein said second electrode is controlled to be a negative voltage.

3. A semiconductor memory device according to claim 1, wherein information greater than 2 bits are stored in said charge trapping region by changing the charge being injected into said charge trapping region.

* * * * *